(12) United States Patent
Lee et al.

(10) Patent No.: US 8,941,199 B2
(45) Date of Patent: Jan. 27, 2015

(54) IMAGE SENSORS

(75) Inventors: Kyung-Ho Lee, Gyeonggi-do (KR);
Jung-Chak Ahn, Gyeonggi-do (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 0 days.

(21) Appl. No.: 13/431,306

(22) Filed: Mar. 27, 2012

(65) Prior Publication Data

US 2012/0248560 A1    Oct. 4, 2012

(30) Foreign Application Priority Data

Mar. 29, 2011    (KR) .................... 10-2011-0028188

(51) Int. Cl.
*H01L 31/02*    (2006.01)
*H01L 31/0232*    (2014.01)
*H01L 27/146*    (2006.01)

(52) U.S. Cl.
CPC ...... *H01L 27/14627* (2013.01); *H01L 27/1463* (2013.01); *H01L 27/1464* (2013.01); *H01L 27/14621* (2013.01)
USPC ....................................................... 257/432

(58) Field of Classification Search
CPC ... H01L 31/0232; H01L 31/02; H01L 27/146; H01L 27/307
USPC ................................................. 257/432, 443
See application file for complete search history.

(56) References Cited

U.S. PATENT DOCUMENTS

| | | | |
|---|---|---|---|
| 7,452,742 B2 | 11/2008 | Kanbe | |
| 7,671,314 B2 * | 3/2010 | Lee et al. | .................... 250/208.1 |
| 8,169,011 B2 * | 5/2012 | Oh | ................................ 257/292 |
| 2008/0203452 A1 | 8/2008 | Moon et al. | |
| 2011/0037883 A1* | 2/2011 | Lee et al. | ....................... 348/273 |
| 2011/0049330 A1* | 3/2011 | Adkisson et al. | ........... 250/208.1 |
| 2011/0101482 A1* | 5/2011 | Meynants | ...................... 257/432 |

FOREIGN PATENT DOCUMENTS

| | | | |
|---|---|---|---|
| JP | 08-241977 A | 9/1996 | |
| JP | 2006019360 A | 1/2006 | |
| KR | 10-0825808 B1 | 4/2008 | |
| KR | 20110079323 A * | 7/2011 | ............ H01L 27/146 |

* cited by examiner

*Primary Examiner* — Matthew Landau
*Assistant Examiner* — Damon Hillman
(74) *Attorney, Agent, or Firm* — Harness, Dickey & Pierce, P.L.C.

(57) ABSTRACT

An image sensor includes a semiconductor substrate, a plurality of photo detecting elements and a backside protection pattern. The plurality of photo detecting elements may be formed in an upper portion of the semiconductor substrate. The plurality of photo detecting elements may be separate from each other. The backside protection pattern may be formed in a lower portion of the semiconductor substrate between the plurality of photo detecting elements.

19 Claims, 33 Drawing Sheets

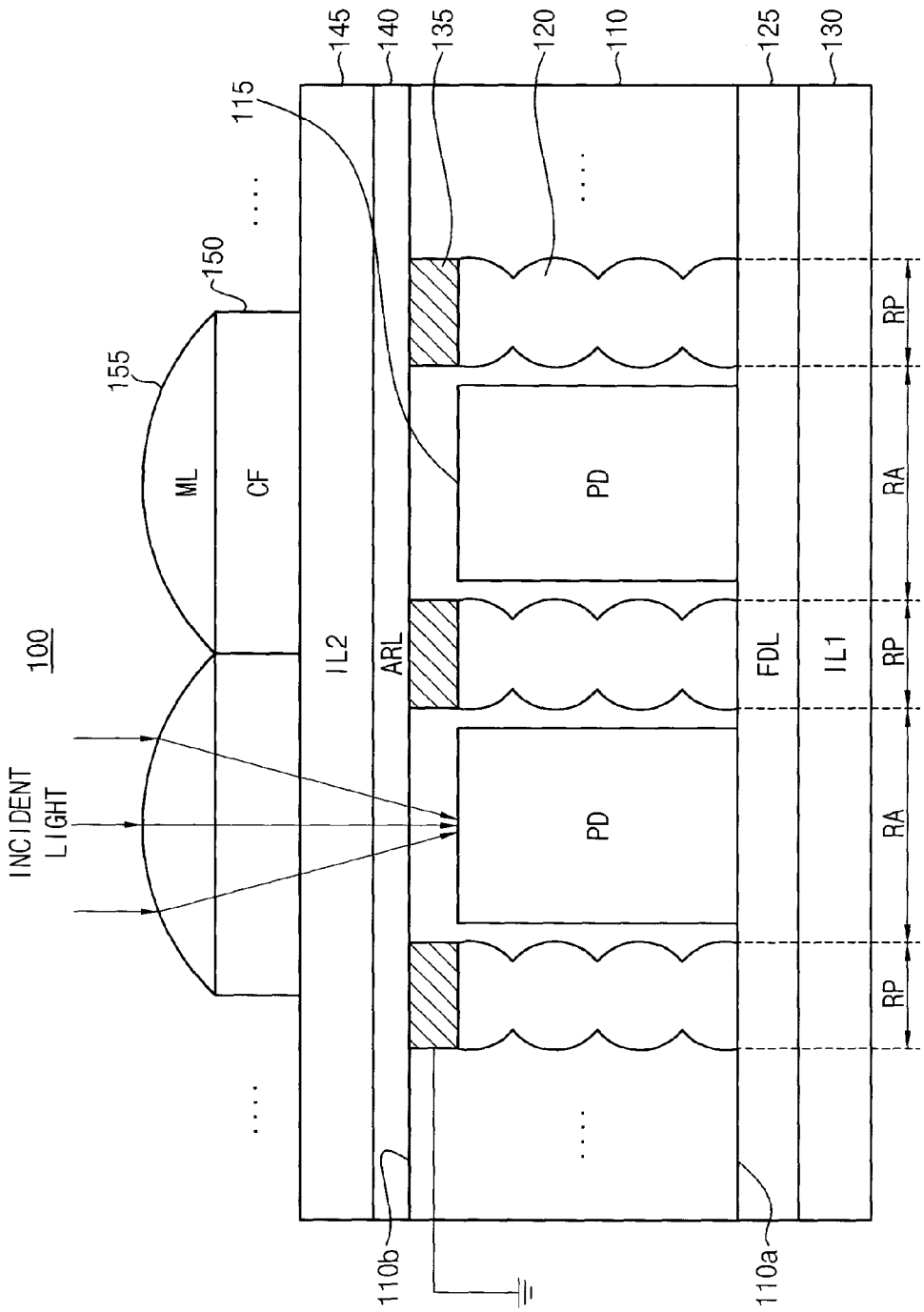

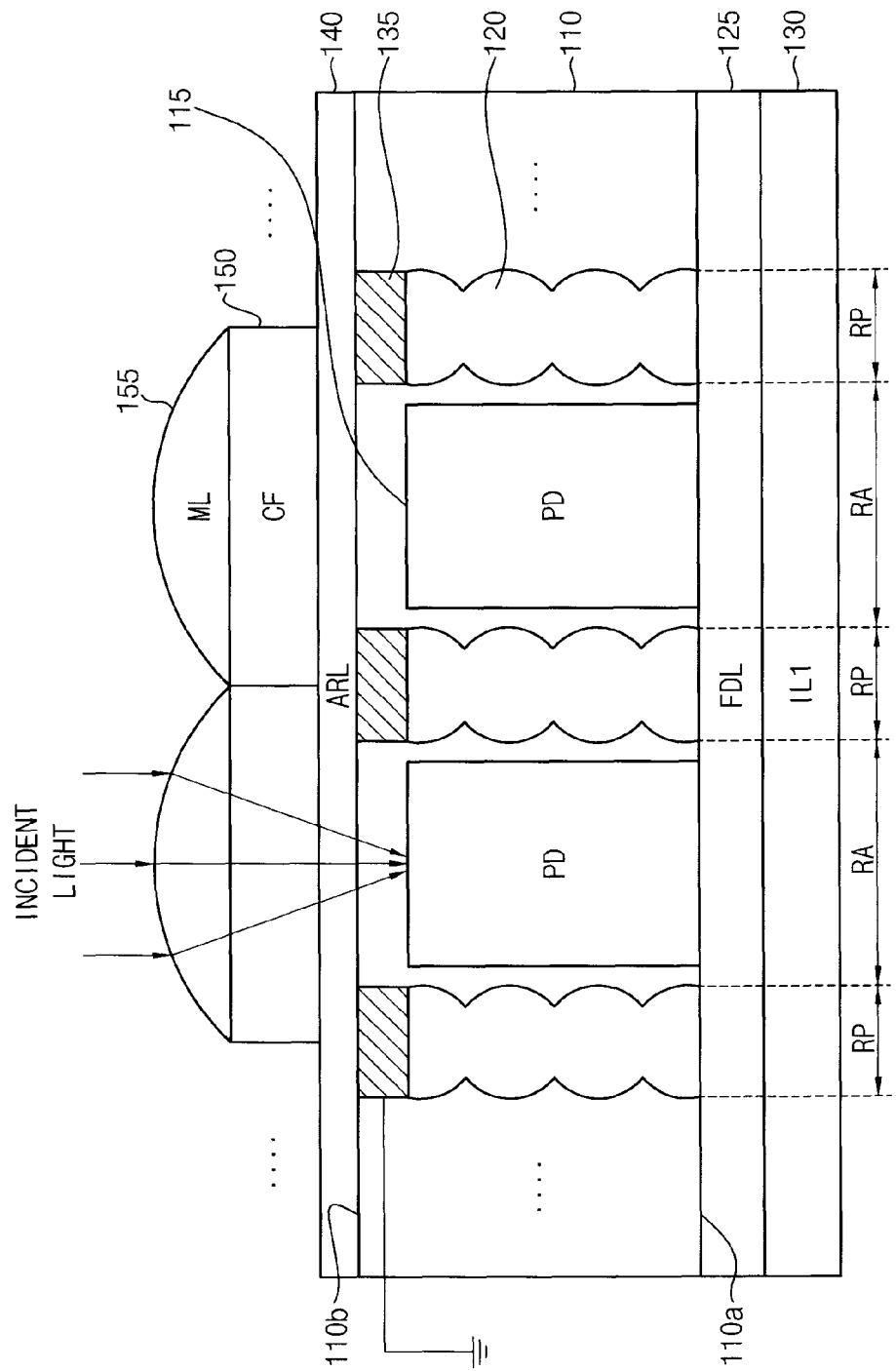

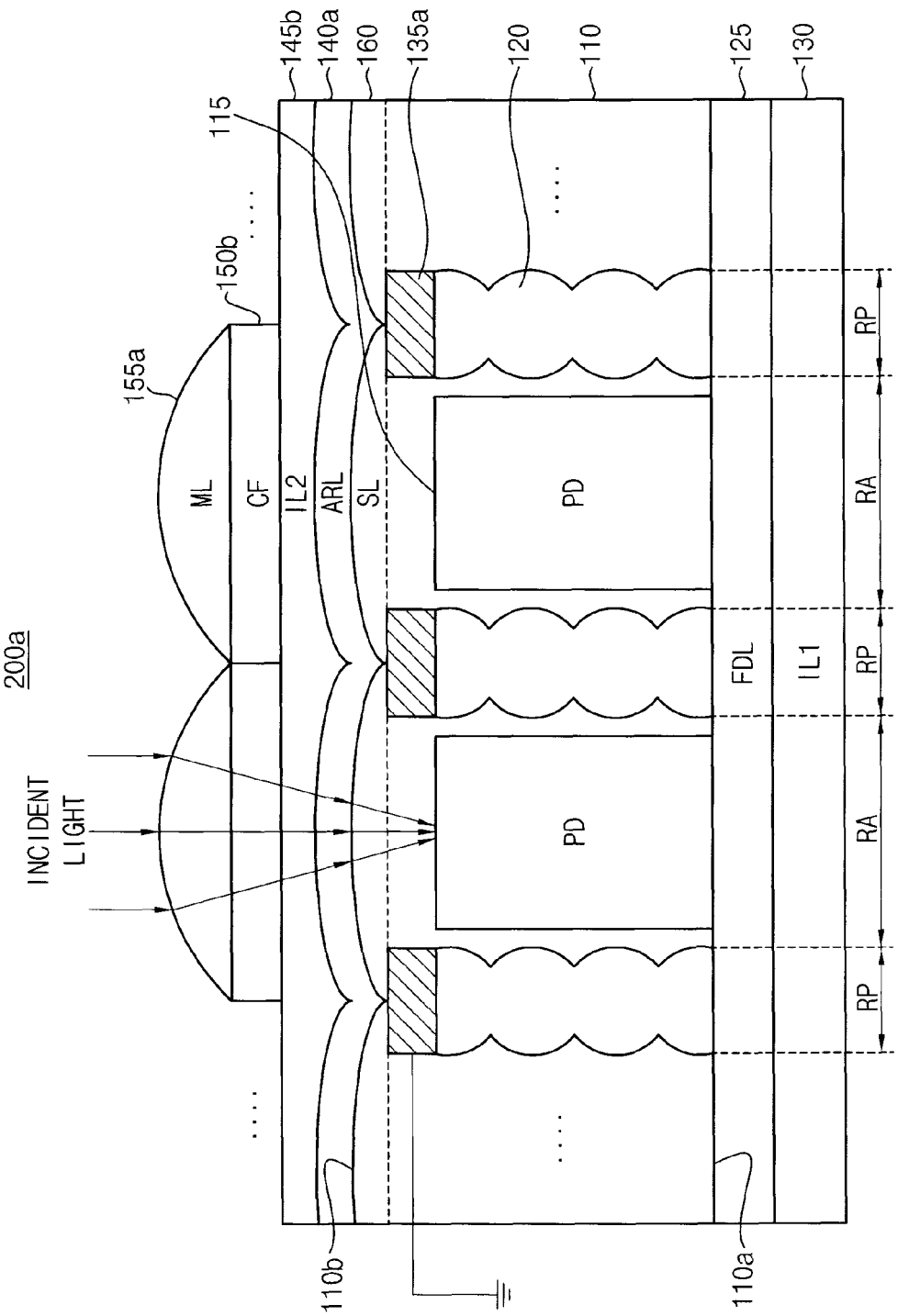

FIG. 8D

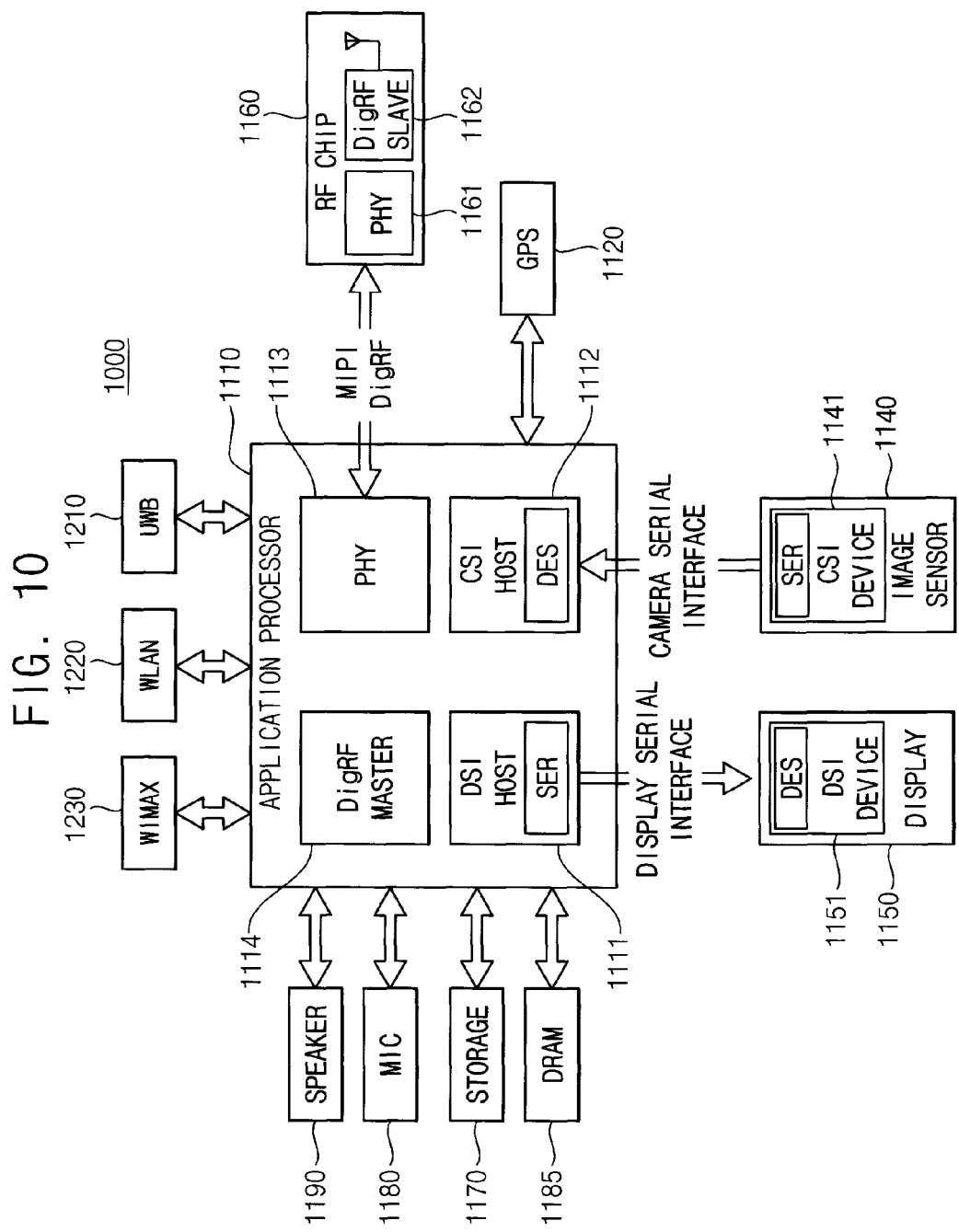

120; # IMAGE SENSORS

CROSS-REFERENCE TO RELATED APPLICATION

This application claims priority under 35 USC §119 to Korean Patent Application No. 2011-0028188, filed on Mar. 29, 2011, in the Korean Intellectual Property Office (KIPO), the entire contents of which are herein incorporated by reference.

BACKGROUND

1. Technical Field

Example embodiments relate to an image sensor, and more particularly, to a back-illuminated image sensor.

2. Description of the Related Art

An image sensor is a device that transforms incident light to an electric signal. A charge coupled device (CCD) image sensor and a complementary metal oxide semiconductor (CMOS) image sensor may be used. To improve sensing performance, a backside illuminated image sensor (BIS) that performs photoelectric transformation in response to an incident light passing through a back surface of a semiconductor substrate has been used.

SUMMARY

Example embodiments provide an image sensor capable of having improved sensing performance (e.g., light guiding efficiency and light sensitivity).

According to example embodiments, an image sensor may include a semiconductor substrate, a plurality of photo detecting elements and a backside protection pattern. The plurality of photo detecting elements may be formed in an upper portion of the semiconductor substrate. The plurality of photo detecting elements may be separate from each other. The backside protection pattern may be formed in a lower portion of the semiconductor substrate between the plurality of photo detecting elements.

Each photo detecting element of the plurality of photo detecting elements may be disposed in one of a plurality of active areas of the semiconductor substrate. The backside protection pattern may be disposed in a surrounding area of the semiconductor substrate. The plurality of active areas may be surrounded by the surrounding area.

The surrounding area may correspond to a grid pattern. Each active area of the plurality of active areas may correspond to a circle or a polygon. Each active area of the plurality of active areas may have a size which is the same as or different from a size of another active area of the plurality of active areas.

The image sensor may further include an isolation pattern. The isolation pattern may be formed on the backside protection pattern in the semiconductor substrate between the plurality of photo detecting elements. A ground voltage may be provided to the image sensor through the backside protection pattern and the isolation pattern.

The image sensor may further include an anti-reflection layer. The anti-reflection layer may be formed on a back surface of the semiconductor substrate. The anti-reflection layer may include negative fixed charges.

The image sensor may further include a plurality of color filters and a plurality of micro lenses. The plurality of color filters may be formed on the anti-reflection layer. Each color filter of the plurality of color filters may correspond to one of the plurality of photo detecting elements, respectively. The plurality of micro lenses may be formed on the plurality of color filters. Each micro lens of the plurality of micro lenses may be disposed corresponding to one of the plurality of photo detecting elements, respectively.

The semiconductor substrate may have a plurality of curved back surfaces. Each of the plurality of curved back surfaces may correspond to one of the plurality of photo detecting elements, respectively. Each curved back surface of the semiconductor substrate may be a convex surface. Each photo detecting element of the plurality of photo detecting elements may receive light through each convex surface of the plurality of convex surfaces.

The backside protection pattern may be doped with impurities which have the same conductivity type as a conductivity type of impurities in the semiconductor substrate. A doping density of the backside protection pattern may be higher than a doping density of the semiconductor substrate.

According to example embodiments, an image sensor includes a semiconductor substrate, a plurality of photo detecting elements, a first backside protection pattern, and a plurality of second backside protection patterns. The plurality of photo detecting elements may be formed in an upper portion of the semiconductor substrate. The plurality of photo detecting elements may be separate from each other. The first backside protection pattern may be formed in a lower portion of the semiconductor substrate between the plurality of photo detecting elements. The plurality of second backside protection patterns may be formed in the lower portion of the semiconductor substrate under the plurality of photo detecting elements. Each second backside protection pattern may have a thickness different from a thickness of the first backside protection pattern.

The thickness of each second backside protection pattern of the plurality of second backside protection patterns may be smaller than the thickness of the first backside protection pattern. Each second backside protection pattern of the plurality of second backside protection patterns may be disposed in one of a plurality of active areas of the semiconductor substrate. The first backside protection pattern may be disposed in a surrounding area of the semiconductor substrate. The plurality of active areas may be surrounded by the surrounding area.

According to example embodiments, an image sensor may include a photo detecting element in an active area of a semiconductor substrate, and a backside protection pattern in a surrounding area of the semiconductor substrate, the active area surrounded by the surrounding area.

The active area may be a plurality of active areas, and the surrounding area may correspond to a grid pattern. Each active area of the plurality of active areas may correspond to one of a circle and a polygon. A size of each active area of the plurality of active areas may be the same or different.

Accordingly, in the image sensor according to example embodiments, the backside protection pattern is partially formed in the lower portion of the semiconductor substrate. For example, the backside protection pattern may be formed in the surrounding area of the lower portion of the semiconductor substrate, and may not be formed in the active areas of the lower portion of the semiconductor substrate (e.g., in the lower portion of the semiconductor substrate under the plurality of photo detecting elements). Thus, quantum efficiency may be improved, and optical crosstalk may be efficiently reduced in the image sensor without a decrease in fill factor. In addition, the image sensor may receive a ground voltage through the backside protection pattern without any additional contacts.

BRIEF DESCRIPTION OF THE DRAWINGS

Illustrative, non-limiting example embodiments will be more clearly understood from the following detailed description taken in conjunction with the accompanying drawings.

FIG. 1 is a cross-sectional view of a portion of an image sensor according to example embodiments.

FIGS. 3A, 3B, 3C, 3D, 3E, 3F, 3G, 3H, 3I and 3J are cross-sectional views of an image sensor for describing a method of fabricating the image sensor of FIG. 1.

FIGS. 8A, 8B, 8C and 8D are cross-sectional views of a portion of an image sensor according to example embodiments.

FIG. 10 is a block diagram illustrating an example of an interface used for the electronic system of FIG. 9.

DETAILED DESCRIPTION OF EXAMPLE EMBODIMENTS

Figure 2A:
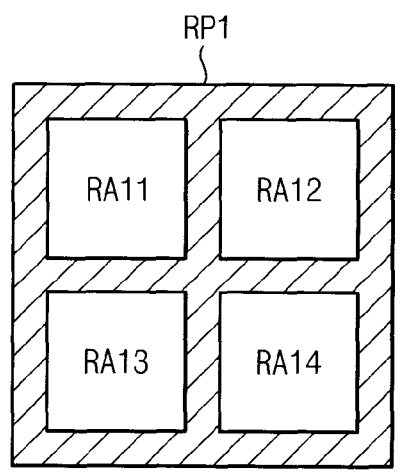
FIGS. 2A, 2B, 2C and 2D are diagrams for describing examples of a backside protection pattern included in the image sensor of FIG. 1.

Various example embodiments will be described more fully with reference to the accompanying drawings, in which example embodiments are shown. The inventive concepts may, however, be embodied in many different forms and should not be construed as limited to example embodiments set forth herein. Rather, these example embodiments are provided so that this disclosure will be thorough and complete, and will fully convey the scope of the inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a portion of an image sensor according to example embodiments. Referring to FIG. 1, an image sensor 100 includes a semiconductor substrate 110, a plurality of photo detecting (PD) elements 115 and a backside protection pattern 135. The image sensor 100 may further include an isolation pattern 120, a frontside protection layer (FDL) 125, a first dielectric layer (IL1) 130, an anti-reflection layer (ARL) 140, a second dielectric layer (IL2) 145, a plurality of color filters (CF) 150 and a plurality of micro lenses (ML) 155.

The image sensor 100 may be one of various image sensors, e.g., a complementary metal-oxide semiconductor (CMOS) image sensor and/or a charge-coupled device (CCD) image sensor. Hereinafter, the image sensor 100 according to example embodiments will be described based on the CMOS image sensor.

The semiconductor substrate 110 has a front surface 110a and a back surface 110b. The image sensor 100 may be a backside illuminated image sensor (BIS) that generates image data in response to an incident light passing through the back surface 110b of the semiconductor substrate 110. The semiconductor substrate 110 may include an epitaxial layer (not shown) and may be doped with, for example, p-type impurities.

In the image sensor 100 according to example embodiments, a plurality of gate structures (not illustrated), which transfer and amplify an electric signal corresponding to the incident light, may be disposed on the front surface 110a of the semiconductor substrate 110. The color filters 150 and the micro lenses 155, through which the incident light passes, may be disposed on the back surface 110b of the semiconductor substrate 110. In the BIS, because the gate structures and metal lines connected to the gate structures are not disposed between the micro lenses 155 and the photo detecting elements 115, diffused reflection and/or scattering due to the gate structures and the metal lines may not occur, and the distance from the micro lenses 155 to the photo detecting elements 115 may be shorter. Accordingly, light guiding efficiency and light sensitivity may be improved in the image sensor 100 according to example embodiments.

The plurality of photo detecting elements 115 may be formed in an upper portion of the semiconductor substrate 110. The plurality of photo detecting elements 115 are separated from each other. In other words, the plurality of photo detecting elements 115 may be placed apart from each other and may be arranged at a predetermined or given distance with respect to each other. The photo detecting elements 115 may convert the incident light into an electric signal. For example, the photo detecting elements 115 may generate an electron-hole pair in response to the incident light, and may collect the electron and/or the hole of the electron-hole pair.

Each of the photo detecting elements 115 may include a photo diode, a photo transistor, a photo gate, a pinned photo diode (PPD) and/or a combination thereof.

In example embodiments, each of the photo detecting elements 115 may be disposed in one of a plurality of active areas RA of the upper portion of the semiconductor substrate 110. For example, the plurality of active areas RA may be disposed in a matrix pattern, and thus, the photo detecting elements 115 may be disposed in the matrix pattern. Although not illustrated in FIG. 1, a floating diffusion region may be included in each of the active areas RA of the semiconductor substrate 110.

The backside protection pattern 135 may be formed in a lower portion of the semiconductor substrate 110 between the plurality of photo detecting elements 115. In the BIS, noise may occur due to surface defects that exist, e.g., surface defects caused by a manufacturing process, in a region adjacent to the back surface 110b of the semiconductor substrate 110. The image sensor 100 includes the backside protection pattern 135 to passivate the surface defects. For example, the backside protection pattern 135 may be doped with impurities (e.g., p-type impurities) which have the same conductivity type as a conductivity type of impurities in the semiconductor substrate 110. A doping density of the backside protection pattern 115 may be higher than a doping density of the semiconductor substrate 110.

In example embodiments, the backside protection pattern 135 may be disposed in a surrounding area RP of the lower portion of the semiconductor substrate 110. The plurality of active areas RA may be surrounded by the surrounding area RP. Example embodiments of the active areas RA and the surrounding area RP will be described below in detail with reference to FIGS. 2A, 2B, 2C and 2D.

The isolation pattern 120 may be formed on the backside protection pattern 135 in the semiconductor substrate 110 between the plurality of photo detecting elements 115. Similarly to the backside protection pattern 135, the isolation pattern 120 may be doped with impurities (e.g., p-type impurities) which have the same conductivity type as the conductivity type of the impurities in the semiconductor substrate 110, and a doping density of the isolation pattern 120 may be higher than the doping density of the semiconductor substrate 110. In example embodiments, a ground voltage may be provided to the image sensor 100 through the backside protection pattern 135 and the isolation pattern 120.

The frontside protection layer 125 may be formed on the front surface 110a of the semiconductor substrate 110. To passivate surface defects existed in a region adjacent to the front surface 110a of the semiconductor substrate 110, the frontside protection layer 125 may be doped with impurities (e.g., p-type impurities) which have the same conductivity type as the conductivity type of the impurities in the semiconductor substrate 110. A doping density of the frontside protection layer 125 may be higher than the doping density of the semiconductor substrate 110.

The first dielectric layer 130 may be formed on the front surface 110a of the semiconductor substrate 110, e.g., on the frontside protection layer 125. The gate structures (not illustrated) that process the electric signal may be formed in the first dielectric layer 130. The gate structures may transfer, amplify and output the electric signal generated by the photo detecting elements 115. For example, the gate structures may include a plurality of transfer gates for transferring charges from the photo detecting elements 115 to floating diffusion nodes, a plurality of reset gates for discharging the floating diffusion nodes, a plurality of drive gates for amplifying voltages of the floating diffusion nodes, and a plurality of select gates for outputting the amplified voltages as the electric signal in response to a select signal. A plurality of metal lines (not illustrated) may be formed in the first dielectric layer 130, according to example embodiments. The metal lines may be electrically connected to the gate structures through contacts and/or plugs.

The photo detecting elements 115, and the gate structures may be part of unit pixels. Each unit pixel may have various structures, for example, a one-transistor structure, a three-transistor structure, a four-transistor structure, a five-transistor structure and/or a structure where some transistors are shared by a plurality of unit pixels.

The anti-reflection layer 140 may be formed on the back surface 110b of the semiconductor substrate 110, e.g., on the backside protection pattern 135. The anti-reflection layer 140 may reduce and/or prevent the incident light from being reflected by the back surface 110b of the semiconductor substrate 110. In example embodiments, as will be described below with reference to FIG. 3G, the anti-reflection layer 140 may include negative fixed charges, and thus, the image sensor 100 may effectively reduce dark currents.

Although not illustrated in FIG. 1, the second anti-reflection layer (not illustrated) may be formed between the frontside protection layer 125 and the first dielectric layer 130. The second anti-reflection layer may prevent and/or reduce light passing through a target photo detecting element (i.e., a photo detecting element below the micro lens and color filter through which the light passes) from being captured by adjacent photo detecting elements after being reflected by the first dielectric layer 130.

The second dielectric layer 145 may be formed on the back surface 110b of the semiconductor substrate 110, e.g., on the anti-reflection layer 140. Although not illustrated in FIG. 1, the image sensor 100 may be implemented without the second dielectric layer 145.

The color filters 150 may be formed on the anti-reflection layer 140, e.g., on the second dielectric layer 145. The color filters 150 may be disposed corresponding to the photo detecting elements 115, respectively. For example, a first color filter of the color filters 150 may correspond to a first photo detecting element of the photo detecting elements 115, and a second color filter of the color filters 150 may correspond to a second photo detecting element of the photo detecting elements 115. The color filters 150 may be disposed in the matrix pattern. In example embodiments, the color filters 150 may be a Bayer filter including red filters, green filters and/or blue filters. In example embodiments, the color filters 150 may include yellow filters, magenta filters, and/or cyan filters. The color filters 150 may further include white filters.

The micro lenses 155 may be formed on the color filters 150. The micro lenses 155 may be disposed corresponding to the photo detecting elements 115 and to the color filters 150, respectively. For example, a first micro lens of the micro lenses 155 may correspond to the first photo detecting element of the photo detecting elements 115, and a second micro lens of the micro lenses 155 may correspond to the second photo detecting element of the photo detecting elements 115. Each of the micro lenses 155 may adjust a path of light entering the micro lens such that the light may be focused on a corresponding photo detecting element. The micro lenses 155 may be disposed in the matrix pattern.

According to example embodiments, the image sensor 100 may further include logic circuits (not illustrated) that generate image data based on the electric signal. For example, the image sensor 100 may include a timing generator, a row decoder, a row driver, a correlated double sampler, an analogto-digital converter, a latch unit, and/or a column decoder. The timing generator may provide a timing signal and a control signal to the row decoder and the column decoder. The row driver may provide driving signals to unit pixels in response to signals from the row decoder. The correlated double sampler may sample and hold the electric signal from the unit pixels. The analog-to-digital converter may convert the electric signal into a digital signal. The latch unit may latch the digital signal, and may output the latched signal as the image data in response to signals from the column decoder.

In the manufacturing process of the backside illuminated CMOS image sensor, a grinding process may be performed on the back surface 110b of the semiconductor substrate 110 in order to decrease the thickness of the semiconductor substrate 110. Surface defects, e.g., dangling bonds, may be caused on the back surface 110b of the semiconductor substrate 110 during the grinding process. Further, the surface defects may thermally generate electric charges without any incident light.

As a result, dark currents may be generated by the surface defects in the backside illuminated CMOS image sensor. The dark currents may be displayed on a display screen as a plurality of white spots. In the manufacturing process of the backside illuminated CMOS image sensor, performing a high temperature heat treatment in order to eliminate the surface defects of the back surface 110b of the semiconductor substrate 110 may not be possible because such a process on the back surface 110b of the semiconductor substrate 110 may be performed after the first dielectric layer 130 having multiple-layer metal wirings is formed on the front surface 110a of the semiconductor substrate 110.

In a conventional backside illuminated CMOS image sensor, in order to passivate the surface defects, a backside protection layer is formed in a semiconductor substrate by heavily doping a plurality of impurities (e.g., p-type impurities) into an entire lower portion of the semiconductor substrate. However, the conventional backside illuminated CMOS image sensor has relatively low quantum efficiency and high optical crosstalk between adjacent unit pixels due to the backside protection layer that is entirely formed and heavily doped. Various schemes for reducing a thickness of the backside protection layer or for eliminating the backside protection layer have been proposed. However, in this case, the conventional backside illuminated CMOS image sensor requires additional contacts for receiving a ground voltage, and a ratio of a photo detecting area to a whole area (e.g., a fill factor) of the conventional backside illuminated CMOS image sensor decreases.

In the image sensor 100 according to example embodiments, the backside protection pattern 135 corresponding to the backside protection layer may be partially formed in the lower portion of the semiconductor substrate 110. For example, the backside protection pattern 135 may be formed in the surrounding area RP of the lower portion of the semiconductor substrate 110, and may not be formed in the active areas RA of the lower portion of the semiconductor substrate 110 (e.g., in the lower portion of the semiconductor substrate 110 under the plurality of photo detecting elements 115). The light passing through each micro lens may be mainly focused on a center area of the unit pixel (e.g., each active area). Thus, the image sensor 100 may efficiently increase and/or improve quantum efficiency and may efficiently suppress and/or reduce optical crosstalk without a decrease in fill factor. In addition, the image sensor 100 may receive the ground voltage through the backside protection pattern 135 without any additional contacts.

FIGS. 2A, 2B, 2C and 2D are diagrams for describing examples of a backside protection pattern included in the image sensor of FIG. 1. FIGS. 2A, 2B, 2C and 2D are plan views of the image sensor 100 of FIG. 1, seen from the direction of the back surface 110b of the semiconductor substrate 100. For convenience of illustration, only the surrounding area including the backside protection pattern 135 and the active areas are illustrated in FIGS. 2A, 2B, 2C and 2D.

Referring to FIGS. 1 and 2A, the plurality of photo detecting elements 115 may be formed in the upper portion of the semiconductor substrate 110, and may be disposed in one of a plurality of active areas RA11, RA12, RA13 and RA14 of the semiconductor substrate 110. The backside protection pattern 135 may be formed in the lower portion of the semiconductor substrate 110, and may be disposed in a surrounding area RP1 of the semiconductor substrate 110. The plurality of active areas RA11, RA12, RA13 and RA14 may be surrounded by the surrounding area RP1. In other words, the surrounding area RP1 may be between and/or outside the active areas RA11, RA12, RA13 and RA14. The backside protection pattern 135 may be integrally formed in the lower portion of the semiconductor substrate 110 along the surrounding area RP1.

In example embodiments, the surrounding area RP1 may correspond to a grid pattern having rows and columns. Each of the active areas RA11, RA12, RA13 and RA14 may correspond to a polygon, e.g., a square. Each active area may have a size which is the same as a size of another active area. For example, a size of the first active area RA11 may be substantially the same as a size of the second active area RA12, a size of the third active area RA13 and a size of the fourth active area RA14, respectively.

As described above with reference to FIG. 1, the color filters 150 and the micro lenses 155 may be formed on the back surface 110b of the semiconductor substrate 110. The light passing through each micro lens may be mainly focused on the center area of the unit pixel, e.g., each of the active areas RA11, RA12, RA13 and RA14. Thus, the quantum efficiency may be improved, and the optical crosstalk may be efficiently reduced in the image sensor 100 without a decrease in fill factor.

Figure 2B:
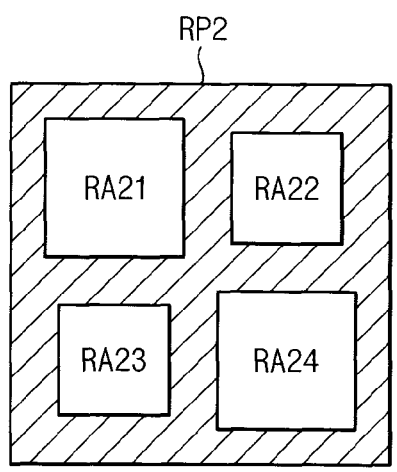

Referring to FIGS. 1 and 2B, a plurality of active areas RA21, RA22, RA23 and RA24 may be surrounded by a surrounding area RP2. Each of the active areas RA21, RA22, RA23 and RA24 may correspond to a polygon, e.g., a square, and may have a size which is the same as or different from a size of another active area. For example, a size of the first active area RA21 may be substantially the same as a size of the fourth active area RA24, and may be larger than a size of the second active area RA22 and a size of the third active area RA23, respectively. In other words, the active areas RA21 and RA24 each of which has a first area may be arranged in a first diagonal direction, and the active areas RA22 and RA23 each of which has a second area may be arranged in a second diagonal direction.

Figure 2C:
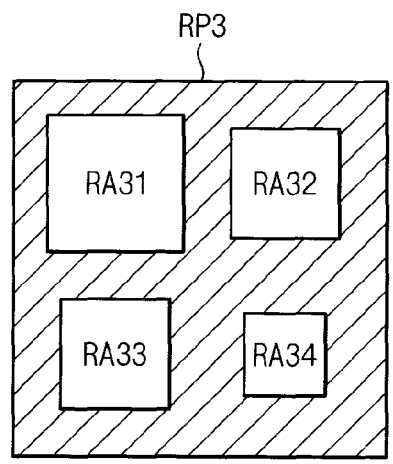

Referring to FIGS. 1 and 2C, a plurality of active areas RA31, RA32, RA33 and RA34 may be surrounded by a surrounding area RP3. Each of the active areas RA31, RA32, RA33 and RA34 may correspond to a polygon, e.g., a square, and may have a size which is the same as or different from a size of another active area. For example, a size of the second active area RA32 may be substantially the same as a size of the third active area RA33, may be smaller than a size of the first active area RA31, and may be larger than a size of the fourth active area RA34.

The arrangement of the active areas having different sizes may be changed, according to example embodiments. For example, although not illustrated in FIG. 2B, the sizes of the second and third active areas may be larger than the sizes of the first and fourth active areas. Although not illustrated in FIG. 2C, the size of the second active area may be substantially the same as the size of the third active area, may be smaller than the size of the fourth active area, and may be larger than the size of the first active area. Alternatively, although not illustrated in FIGS. 2A, 2B and 2C, a first active area having a first size and a second area having a second size may be alternately arranged in a row direction or in a column direction. In example embodiments, a size of each active area may be changed based on a type of a corresponding color filter.

Figure 2D:
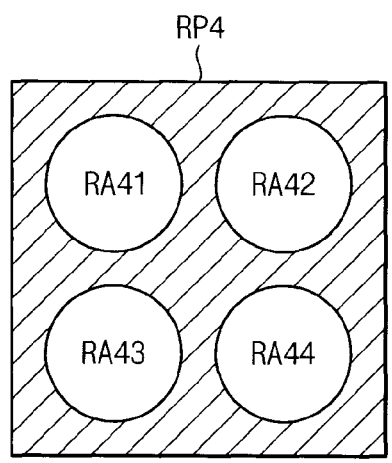

Referring to FIGS. 1 and 2D, a plurality of active areas RA41, RA42, RA43 and RA44 may be surrounded by a surrounding area RP4. Each of the active areas RA41, RA42, RA43 and RA44 may correspond to a circle, and may have a size which is the same as a size of another active area. For example, a size of the first active area RA41 may be substantially the same as a size of the second active area RA42, a size of the third active area RA43 and a size of the fourth active area RA44, respectively. Although not illustrated in FIG. 2D, each active area may have a size which is different from a size of another active area.

Although the image sensor having four active areas is illustrated in FIGS. 2A, 2B, 2C and 2D, the number of active areas included in the image sensor is not limited thereto. If the image sensor has a plurality of active areas disposed in the matrix pattern, one of the patterns illustrated in FIGS. 2A, 2B, 2C and 2D may be repeatedly arranged or at least two of the patterns illustrated in FIGS. 2A, 2B, 2C and 2D may be alternately arranged, according to example embodiments. Although the active areas each of which corresponds to the circle or the square is illustrated in FIGS. 2A, 2B, 2C and 2D, the shapes of active areas included in the image sensor is not limited thereto.

Figure 3A:
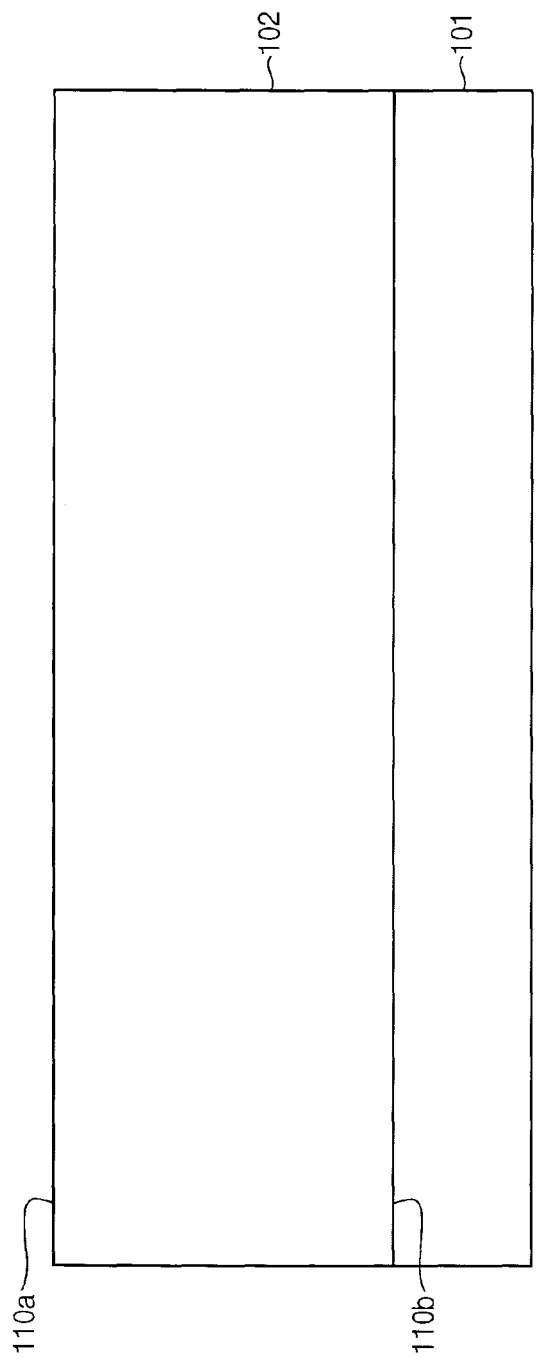

FIGS. 3A, 3B, 3C, 3D, 3E, 3F, 3G, 3H, 3I and 3J are cross-sectional views of an image sensor for describing a method of fabricating the image sensor of FIG. 1. Referring to FIG. 3A, an epitaxial layer 102 (e.g., a p-type epitaxial layer) may be formed on a bulk silicon substrate 101 (e.g., a p-type bulk silicon substrate). The epitaxial layer 102 may be grown on the bulk silicon substrate 101 using silicon source gas (e.g., silane, dichlorosilane (DCS), trichlorosilane (TCS), and/or hexachlorosilane (HCS), or a combination thereof). A semiconductor substrate 110 in FIG. 3E may have a front surface 110a and a back surface 110b by forming the epitaxial layer 102.

Figure 3B:
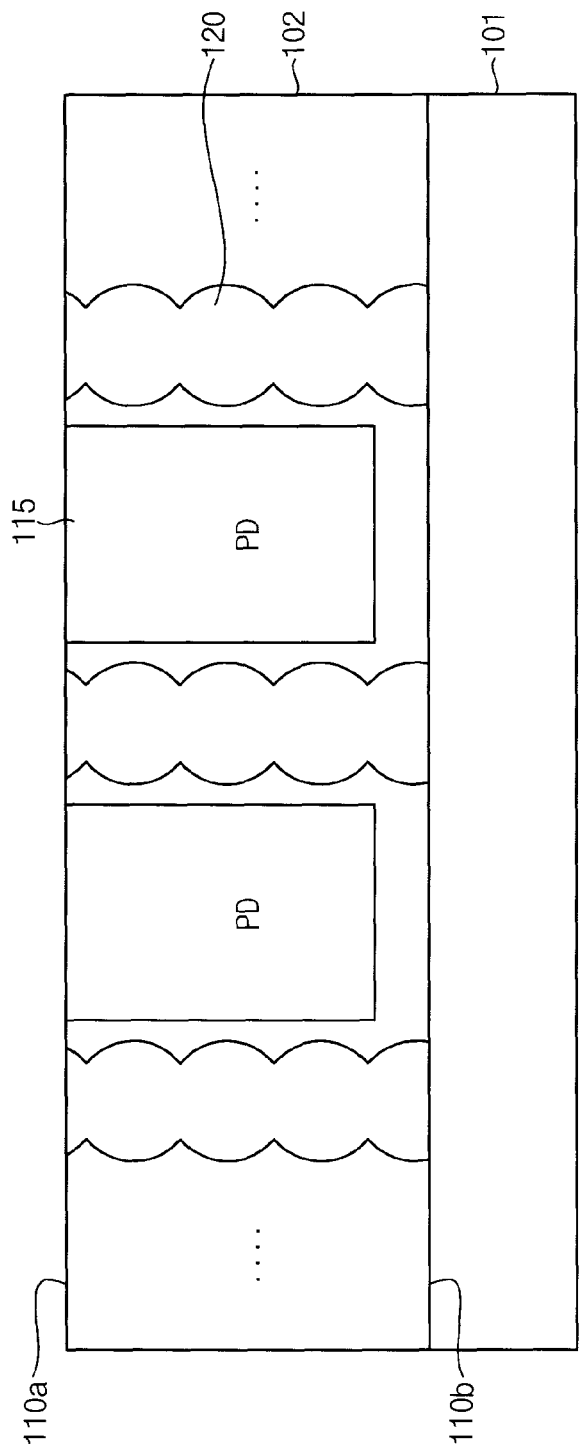

Referring to FIG. 3B, a plurality of photo detecting elements 115 and an isolation pattern 120 may be formed in the epitaxial layer 102. For example, photo diodes may be formed as the photo detecting elements 115 such that regions (e.g., n-type regions) are formed in an upper portion of the epitaxial layer 102 using, for example, an ion implantation process. The plurality of photo detecting elements 115 may be arranged in the upper portion of the epitaxial layer 102 in a matrix pattern. For example, the isolation pattern 120 may be formed such that regions (e.g., (p+)-type regions) are vertically formed in the epitaxial layer 102 using, for example, the ion implantation process. The isolation pattern 120 may be formed before or after the plurality of photo detecting elements 115 are formed.

In example embodiments, the photo detecting elements 115 may be formed by laminating a plurality of doped regions. In this case, an upper doped region may be a (n+)-type region that is formed by implanting (n+)-type ions in the p-type epitaxial layer 102, and a lower doped region may be a (n−)-type region that is formed by implanting (n−)-type ions in the p-type epitaxial layer 102. The isolation pattern 120 may be formed by repeatedly implanting (p+)-type ions in the p-type epitaxial layer 102 with different energies. As the ion implantation process is repeatedly performed with different energies, the isolation pattern 120 may have an embossed shape, as illustrated in FIG. 3B.

Although not illustrated in FIG. 3B, a plurality of element isolation regions may be formed between the photo detecting elements 121, 122 and 123 in the epitaxial layer 102. The element isolation regions may be formed in the epitaxial layer 102 from the front surface 110a. The element isolation regions may include field oxide formed using a shallow trench isolation (STI) process and/or a local oxidation of silicon (LOCOS) process.

Figure 3C:
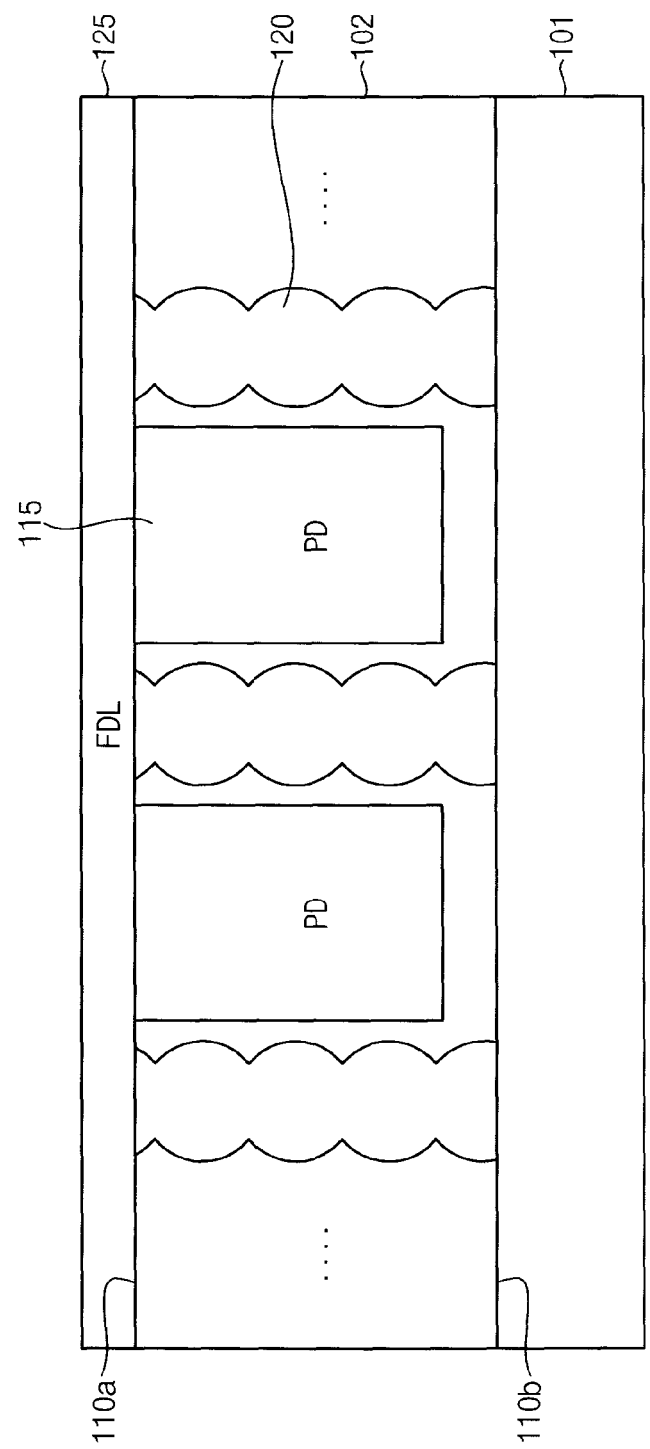

Referring to FIG. 3C, a frontside protection layer 125 may be formed on the front surface 110a of the epitaxial layer 102. For example, the frontside protection layer 125 may be formed such that regions (e.g., (p+)-type regions) may be entirely formed on the front surface 110a of the epitaxial layer 102 using, for example, the ion implantation process.

Figure 3D:
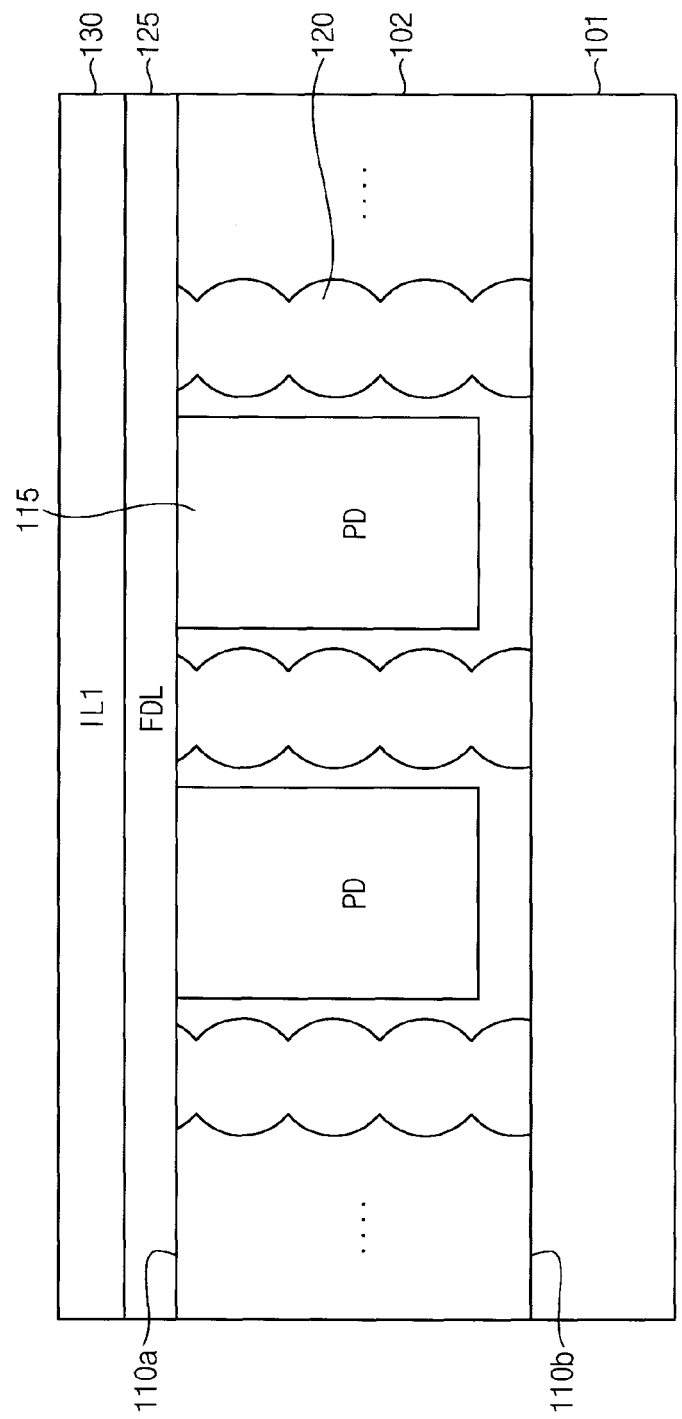

Referring to FIG. 3D, a first dielectric layer 130 may be formed on the frontside protection layer 125. The first dielectric layer 130 may be formed of materials having fluidity (e.g., high density plasma (HDP) oxide, tonen silazene (TOSZ), spin on glass (SOG) and/or undoped silica glass (USG)).

A plurality of gate structures and multi-layer metal lines may be formed in the first dielectric layer 130. For example, the gate structures may be formed by forming a gate dielectric layer and a gate conductive layer on the front surface 110a of the epitaxial layer 102 (e.g., on the frontside protection layer 125), and by patterning the gate dielectric layer and the gate conductive layer. The gate dielectric layer may be formed of, for example, silicon oxide (SiOx), silicon oxynitride (SiOxNy), silicon nitride (SiNx), germanium oxynitride (GeOxNy), germanium silicon oxide (GeSixOy), and/or a material having a high dielectric constant (e.g. hafnium oxide (HfOx), zirconium oxide (ZrOx), aluminum oxide (AlOx), tantalum oxide (TaOx), hafnium silicate (HfSix), and/or zirconium silicate (ZrSix)). The gate conductive layer may be formed of polysilicon, metal and/or a metal compound. The metal lines may be formed by forming a conductive layer of copper, tungsten, titanium and/or aluminum, and by patterning the conductive layer.

Figure 3E:
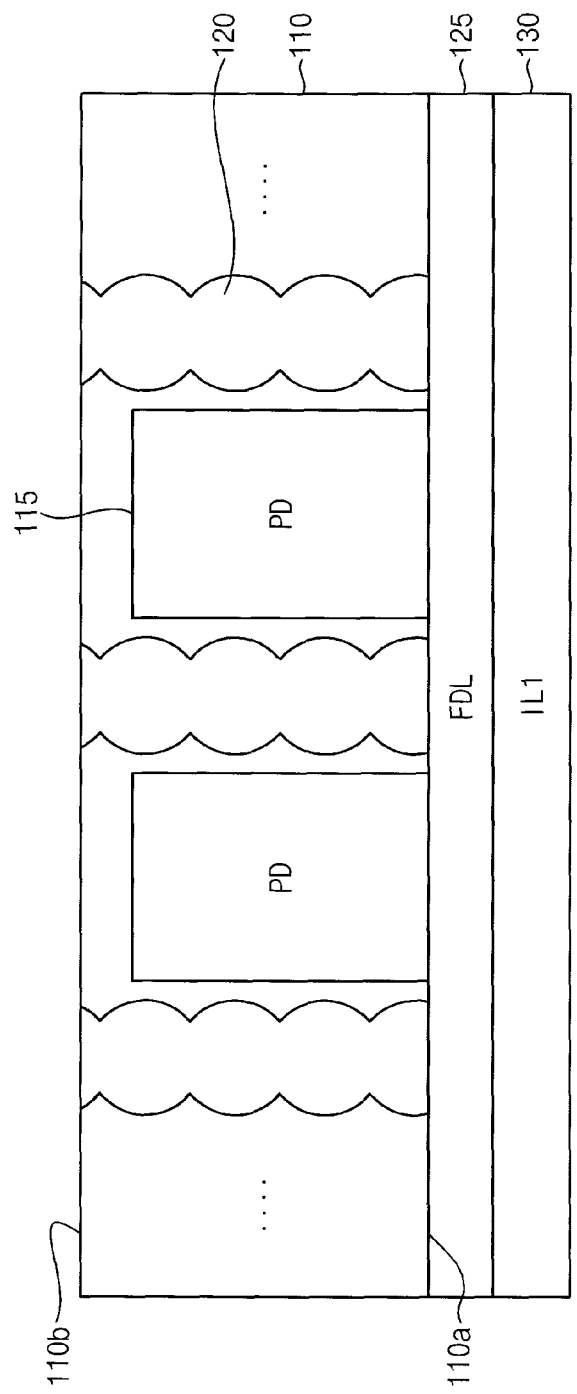

Referring to FIG. 3E, a semiconductor substrate 110 may be formed by grinding the bulk silicon substrate 101 on which the epitaxial layer 102 is formed. The grinding process may be performed by a mechanical process and/or a chemical process. For example, the mechanical process may be performed by rubbing a polishing pad on the back surface 110b of the semiconductor substrate 110. In addition, the chemical process may be performed by injecting chemical materials, e.g., a "slurry", between a polishing pad and the back surface 110b of the semiconductor substrate 110.

In example embodiments, the semiconductor substrate 110 may include only the epitaxial layer 102 after a complete removal of the bulk silicon substrate 101. In example embodiments, the semiconductor substrate 110 may be supported by, for example, an additional semiconductor substrate formed on the first dielectric layer 130. A wet etching process may be performed to minimize and/or reduce contamination on the back surface 110b of the semiconductor substrate 110.

Figure 3F:
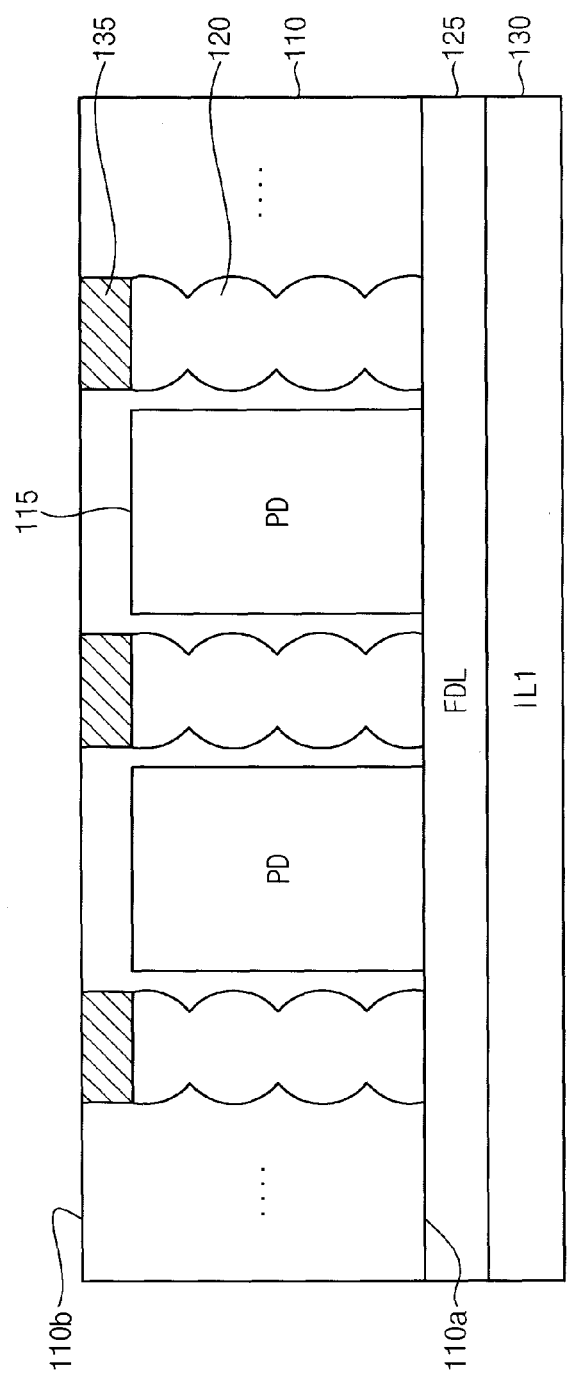

Referring to FIG. 3F, a backside protection pattern 135 may be formed in the semiconductor substrate 110. For example, the backside protection pattern 135 may be formed such that regions (e.g., (p+)-type regions) are partially formed in a lower portion of the semiconductor substrate 110 between the photo detecting elements 115 (e.g., in the lower portion of the semiconductor substrate 110 under the isolation pattern 120) using, for example, the ion implantation process. The backside protection pattern 135 may have a thickness of about 0.1 µm to about 0.5 µm.

In example embodiments, the backside protection pattern 135 may be formed using a mask. The frontside protection layer 125 may be formed without using a mask because the frontside protection layer 125 may be entirely formed on the front surface 110a of the semiconductor substrate 110. However, the backside protection pattern 135 may be partially formed in the lower portion of the semiconductor substrate 110 (e.g., disposed in the surrounding area). Thus, the backside protection pattern 135 may be formed using the mask corresponding to the surrounding area such that (p+)-type ions are implanted in the surrounding area of the lower portion of the semiconductor substrate 110.

Figure 3G:
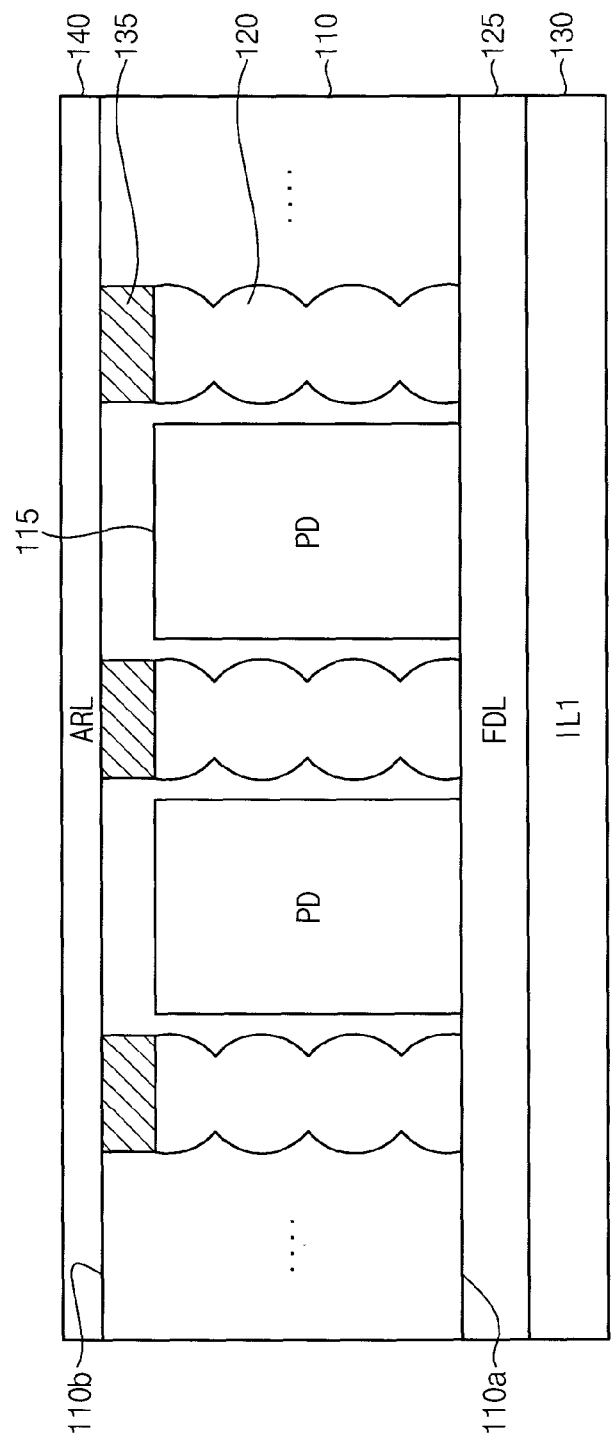

Referring to FIG. 3G, an anti-reflection layer 140 may be formed on the back surface 110b of the semiconductor substrate 110 to prevent and/or reduce incident light from being reflected from the back surface 110b. In example embodiments, the anti-reflective layer 140 may be formed by alternately laminating materials having different refractive indices. A higher light transmittance of the anti-reflective layer 140 may be achieved with increased lamination of such materials.

In example embodiments, the anti-reflective layer 140 may include negative fixed charges. For example, the anti-reflective layer 140 may be formed of metal oxide including a metal element, for example, zirconium (Zr), aluminum (Al), tantalum (Ta), titanium (Ti), Yttrium (Y) and/or lanthanoids. The anti-reflective layer 140 may have at least one crystallized region.

If the anti-reflective layer 140 includes the negative fixed charges, the holes may be accumulated in the lower portion of the semiconductor substrate 110. Electric charges generated by surface defects without any incident light may be coupled with the holes accumulated in the lower portion of the semiconductor substrate 110. Thus, dark currents in the image sensor 100 may be reduced, and light guiding efficiency and light sensitivity may be improved in the image sensor 100 according to example embodiments.

Figure 3H:
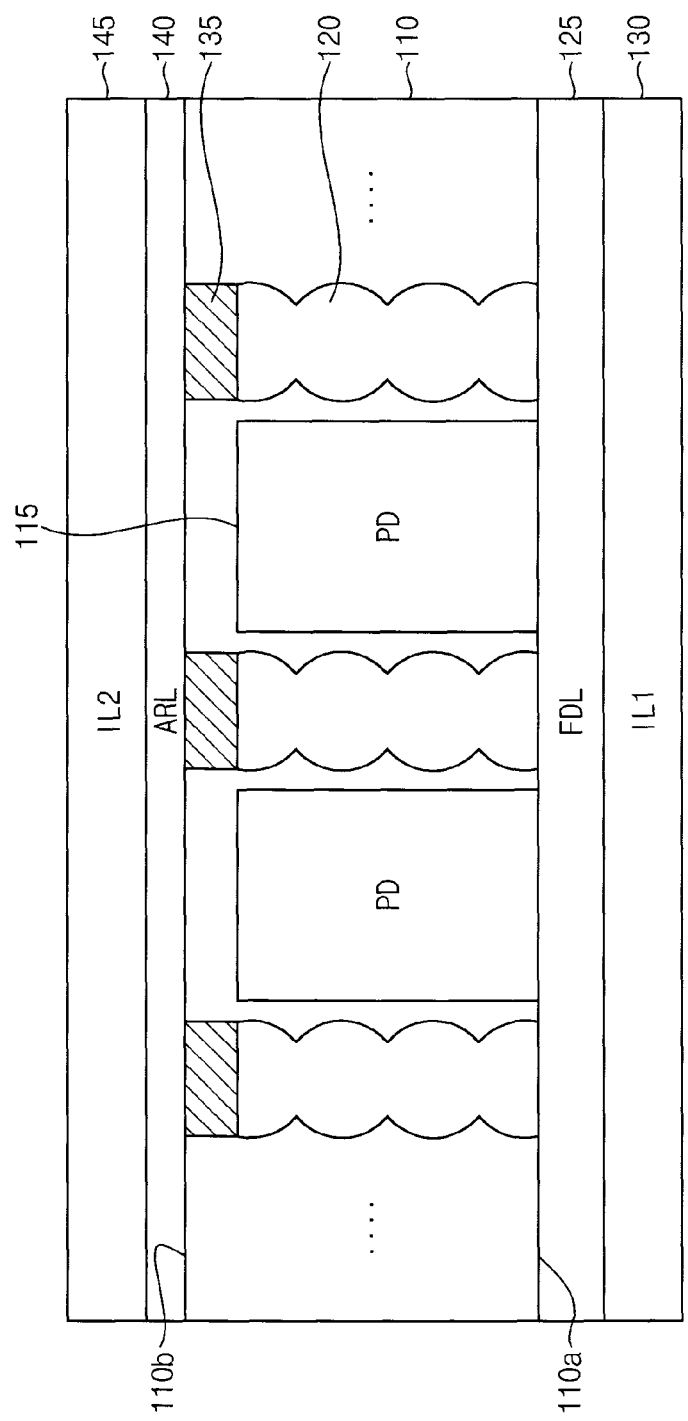
Figure 31:
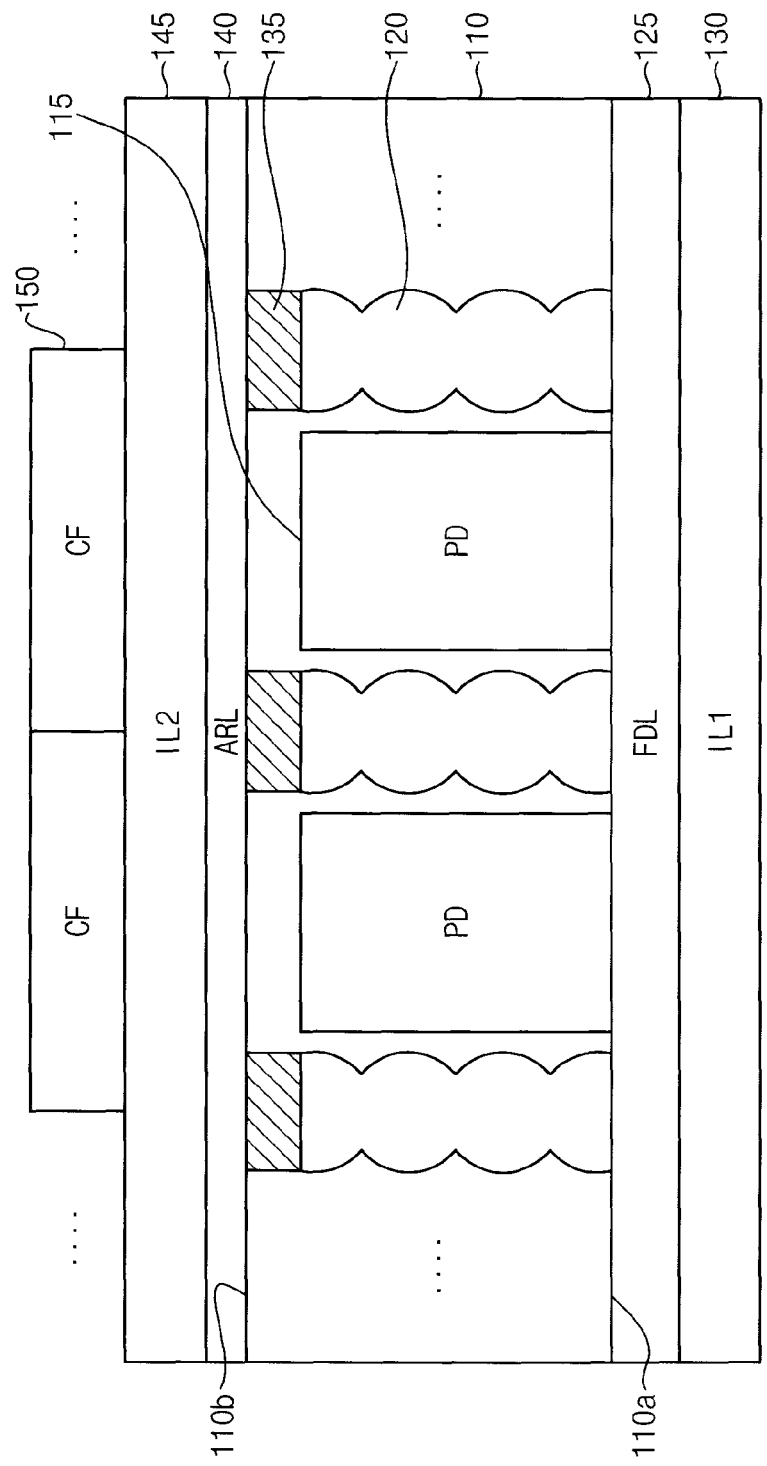

Referring to FIG. 3H, a second dielectric layer 145 may be formed on the anti-reflective layer 140. The second dielectric layer 145 may be formed of, for example, HDP oxide, TOSZ, SOG, and/or USG. In example embodiments, the second dielectric layer 145 may include an optical shielding layer (not illustrated) for preventing and/or reducing incident light from entering an optical black area.

Referring to FIG. 3I, a plurality of color filters 150 may be formed on the second dielectric layer 145. The color filters 150 may be disposed so as to correspond to the photo detecting elements 115, respectively. The color filters 150 may be formed using a dye process, a pigment dispersing process and/or a printing process.

The color filters 150 may be formed by coating the back surface 110b of the semiconductor substrate 110 (e.g., the second dielectric layer 145) with a photosensitive material, e.g., a photo-resist, and by patterning the photosensitivity material, e.g., by performing a photolithography and lithography process using masks. In example embodiments, a planarization layer (not illustrated), for example, an over-coating layer (OCL), may be formed between the color filters 150 and the micro lenses 155 of FIG. 3J.

Figure 3J:
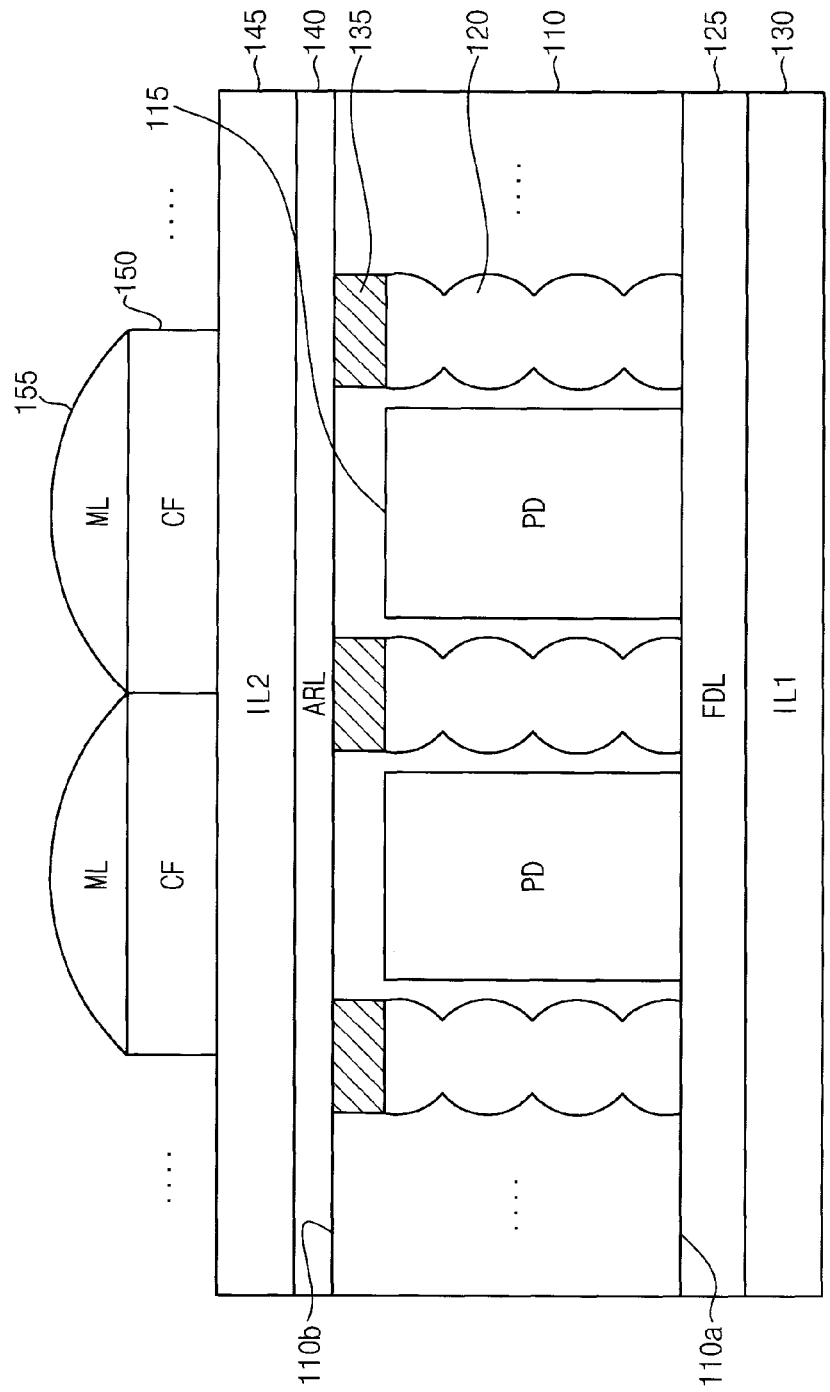

Referring to FIG. 3J, a plurality of micro lenses 155 may be formed on the color filters 150. The micro lenses 155 may be disposed so as to correspond to the photo detecting elements 115, respectively. For example, the micro lenses 155 may be formed by forming patterns corresponding to the photo detecting elements 115 with photoresists having light-penetrability and by reflowing the patterns to have convex shapes. A bake process may be performed on the micro lenses 155 to maintain the convex shapes.

Although methods of fabricating the image sensor of FIG. 1 are described with reference to FIGS. 3A through 3J, methods of fabricating image sensors according to example embodiments are not to be construed as limited to the specific methods disclosed.

Figure 4:
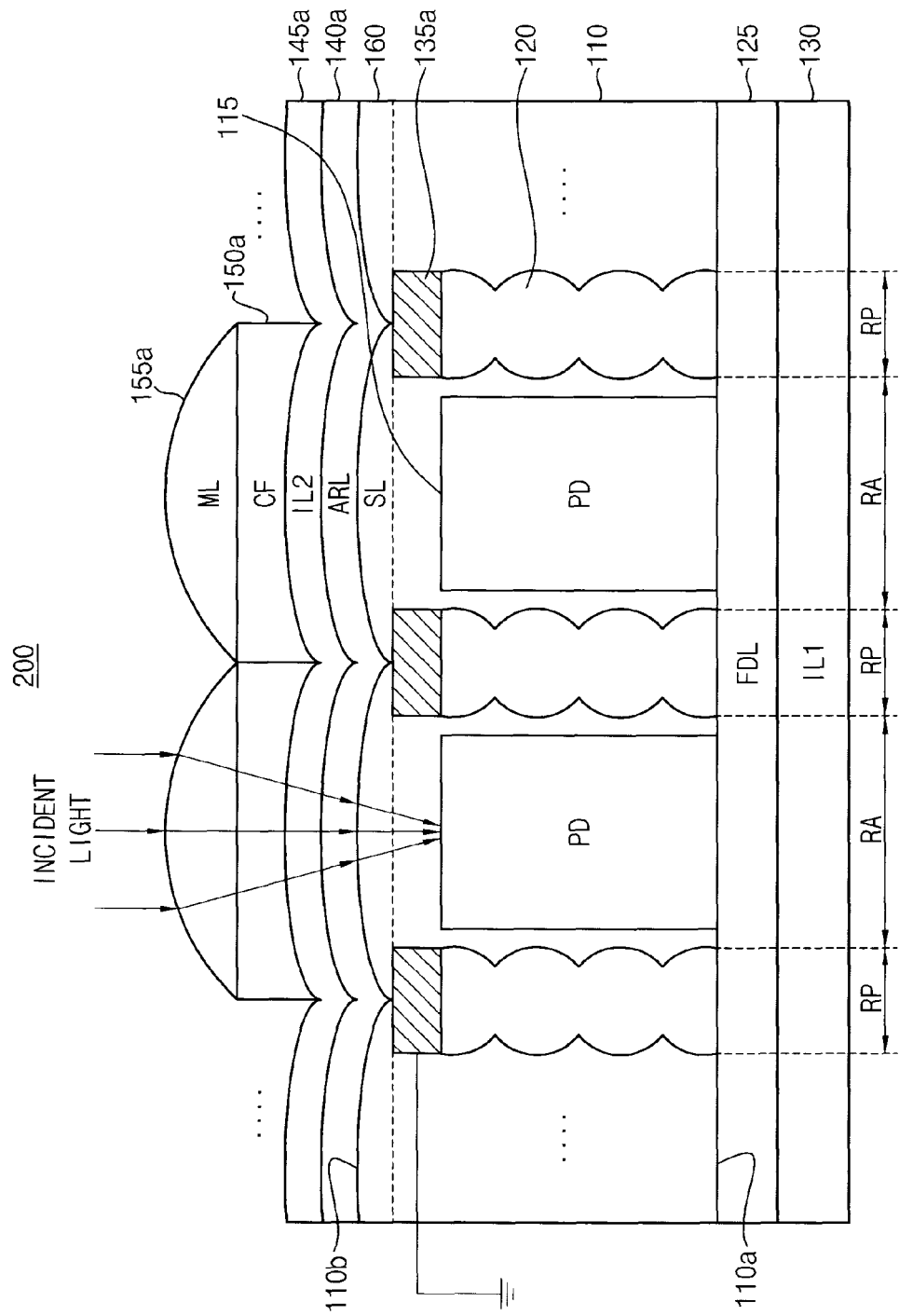
FIG. 4 is a cross-sectional view of a portion of an image sensor according to example embodiments.

FIG. 4 is a cross-sectional view of a portion of an image sensor according to example embodiments. Referring to FIG. 4, an image sensor 200 includes a semiconductor substrate 110, a plurality of photo detecting elements (PD) 115 and a backside protection pattern 135a. The image sensor 200 may further include an isolation pattern 120, a frontside protection layer (FDL) 125, a first dielectric layer (IL1) 130, a plurality of silicon lenses (SL) 160, an anti-reflection layer (ARL) 140a, a second dielectric layer (IL2) 145a, a plurality of color filters (CF) 150a and a plurality of micro lenses (ML) 155a.

In comparison with the image sensor 100 of FIG. 1, the image sensor 200 may further include the plurality of silicon lenses 160. The semiconductor substrate 110 may have a plurality of curved back surfaces, each of which is formed corresponding to one of the plurality of photo detecting elements 115. The plurality of curved back surfaces of the semiconductor substrate 110 may be formed as the plurality of silicon lenses 160. Each curved back surface of the semiconductor substrate 110 may be a convex surface, and each of the photo detecting elements 115 may receive light through each convex surface. The light is effectively focused on a corresponding photo detecting element because of a dual-lens structure that includes a first lens (e.g., a micro lens) and a second lens (e.g., a silicon lens). Thus, light guiding efficiency and light sensitivity may be improved in the image sensor 200 according to example embodiments.

The semiconductor substrate 110 has a front surface 110a and a back surface 110b. The plurality of photo detecting elements 115 are formed in an upper portion of the semiconductor substrate 110, and are separated from each other. The backside protection pattern 135 may be formed in a lower portion of the semiconductor substrate 110 between the plurality of photo detecting elements 115.

Each of the photo detecting elements 115 may be disposed in one of a plurality of active areas RA of the upper portion of the semiconductor substrate 110. The backside protection pattern 135 may be disposed in a surrounding area RP of the lower portion of the semiconductor substrate 110. The plurality of active areas RA may be surrounded by the surrounding area RP. The active areas RA and the surrounding area RP may be implemented as illustrated in FIGS. 2A, 2B, 2C and 2D.

The isolation pattern 120 may be formed in the semiconductor substrate 110 between the plurality of photo detecting elements 115. The frontside protection layer 125 may be formed on the front surface 110a of the semiconductor substrate 110. The first dielectric layer 130 may be formed on the frontside protection layer 125, and may include gate structures (not shown) that transfer, amplify and output the electric signal generated by the photo detecting elements 115. The anti-reflection layer 140a may be formed on the back surface 110b of the semiconductor substrate 110. The second dielectric layer 145a may be formed on the anti-reflection layer 140a.

The anti-reflection layer 140a and the second dielectric layer 145a may be curved corresponding to the curved back surfaces of the semiconductor substrate 110. Although not illustrated in FIG. 4, the image sensor 200 may be implemented without the second dielectric layer 145a. The color filters 150a may be formed on the second dielectric layer 145a, and may be disposed corresponding to the photo detecting elements 115, respectively. A surface of the color filters 150a farthest from the photo detecting elements 115 may be curved corresponding to the curved back surfaces of the semiconductor substrate 110. The micro lenses 155a may be formed on the color filters 150a, and may be disposed corresponding to the photo detecting elements 115 and to the color filters 150a, respectively. A planarization layer (not illustrated) may be formed between the color filters 150a and the micro lenses 155a.

In the image sensor 200 according to example embodiments, the backside protection pattern 135 corresponding to the backside protection layer is partially formed in the lower portion of the semiconductor substrate 110 (e.g., formed in the lower portion of the semiconductor substrate 110 between the photo detecting elements 115). Thus, the image sensor 200 may efficiently increase and/or improve quantum efficiency and may efficiently suppress and/or reduce optical crosstalk without a decrease in fill factor. In addition, the image sensor 200 may have the dual-lens structure, thereby improving light guiding efficiency and light sensitivity.

FIGS. 5A, 5B, 5C, 5D, 5E, 5F and 5G are cross-sectional views of an image sensor for describing a method of fabricating the image sensor of FIG. 4. In the method of fabricating the image sensor 200, a step of forming an epitaxial layer 102, a step of forming a plurality of photo detecting elements 115 and an isolation pattern 120, a step of forming a frontside protection layer 125, a step of forming a first dielectric layer 130 and a step of forming a semiconductor substrate 110 by grinding the bulk silicon substrate 101 may be substantially the same as the steps as illustrated in FIGS. 3A, 3B, 3C, 3D and 3E, respectively.

Figure 5A:
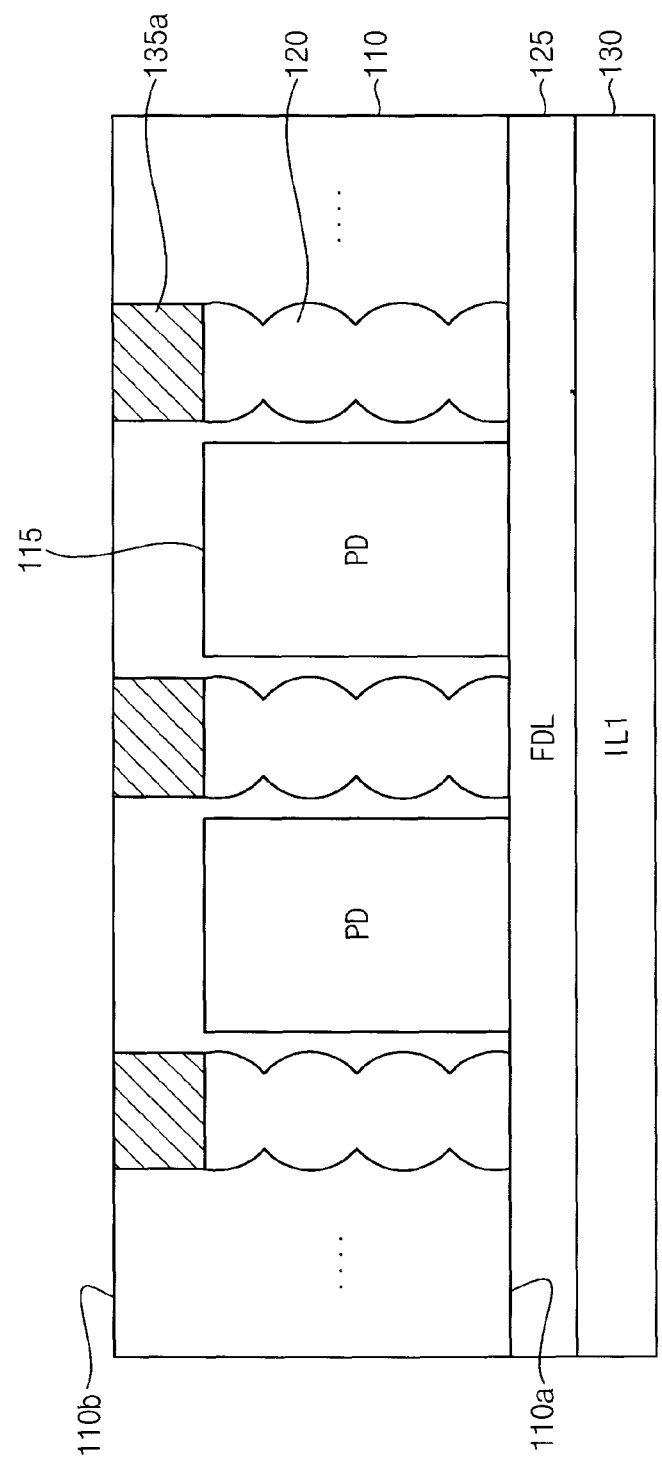
FIGS. 5A, 5B, 5C, 5D, 5E, 5F and 5G are cross-sectional views of an image sensor for describing a method of fabricating the image sensor of FIG. 4.

Referring to FIG. 5A, a backside protection pattern 135a may be formed in the semiconductor substrate 110. For example, the backside protection pattern 135a may be formed such that regions (e.g., (p+)-type regions) are partially formed in a lower portion of the semiconductor substrate 110 between the photo detecting elements 115 (e.g., in the lower portion of the semiconductor substrate 110 under the isolation pattern 120) using, for example, the ion implantation process. To form a plurality of silicon lenses 160 in FIG. 5C, the backside protection pattern 135a may have a thickness that is larger than the thickness of the backside protection pattern 135 in FIG. 3F.

Figure 5B:
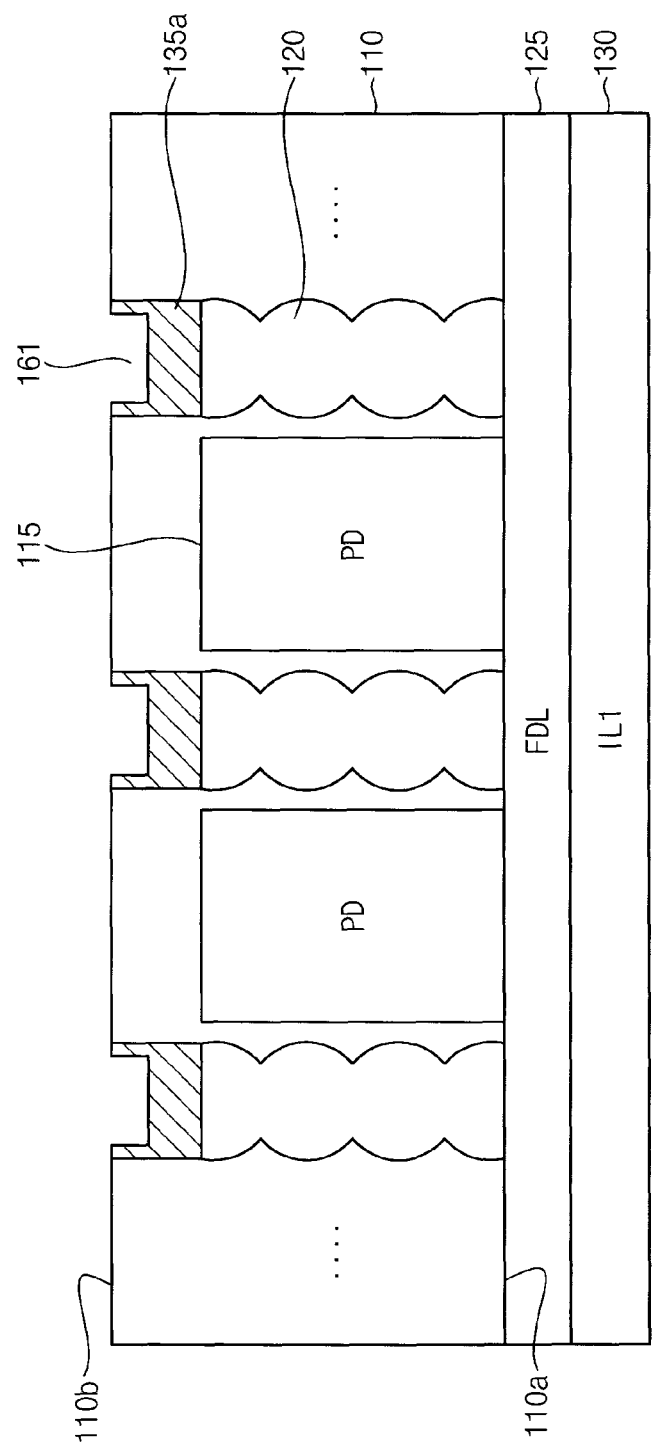

Referring to FIG. 5B, a back trench 161 may be formed at the back surface 110b of the semiconductor substrate 110. For example, the back trench 161 may be formed by etching an upper region of the backside protection pattern 135a to a predetermined or given depth using, for example, a dry etching process and/or a wet etching process. The back trench 161 may be formed so as to correspond to the backside protection pattern 135a, thereby reducing surface defects of the back surface 110b of the semiconductor substrate 110. The depth and the shape of the back trench 161 may be changed, according to example embodiments.

Figure 5C:
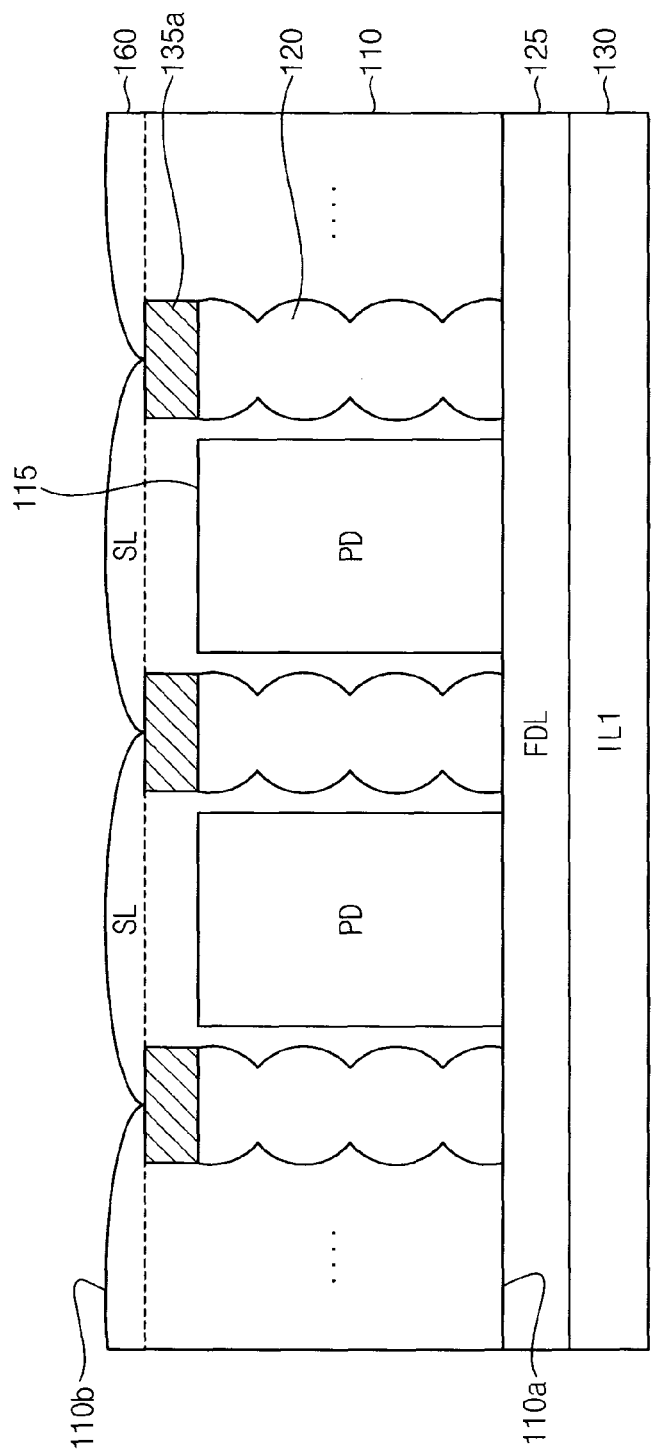

Referring to FIG. 5C, a plurality of curved surfaces may be formed at the back surface 110b of the semiconductor substrate 110. The curved back surfaces of the semiconductor substrate 110 may be disposed so as to correspond to the photo detecting elements 115, respectively. For example, the curved back surfaces may be formed by reflowing the patterns of the back surface 110b formed by the back trench 161 using, for example, a laser annealing process. The curved back surfaces may be formed as the silicon lenses 160 and may have convex shapes. A bake process may be performed on the silicon lenses 160 to maintain the convex shapes.

Figure 5D:
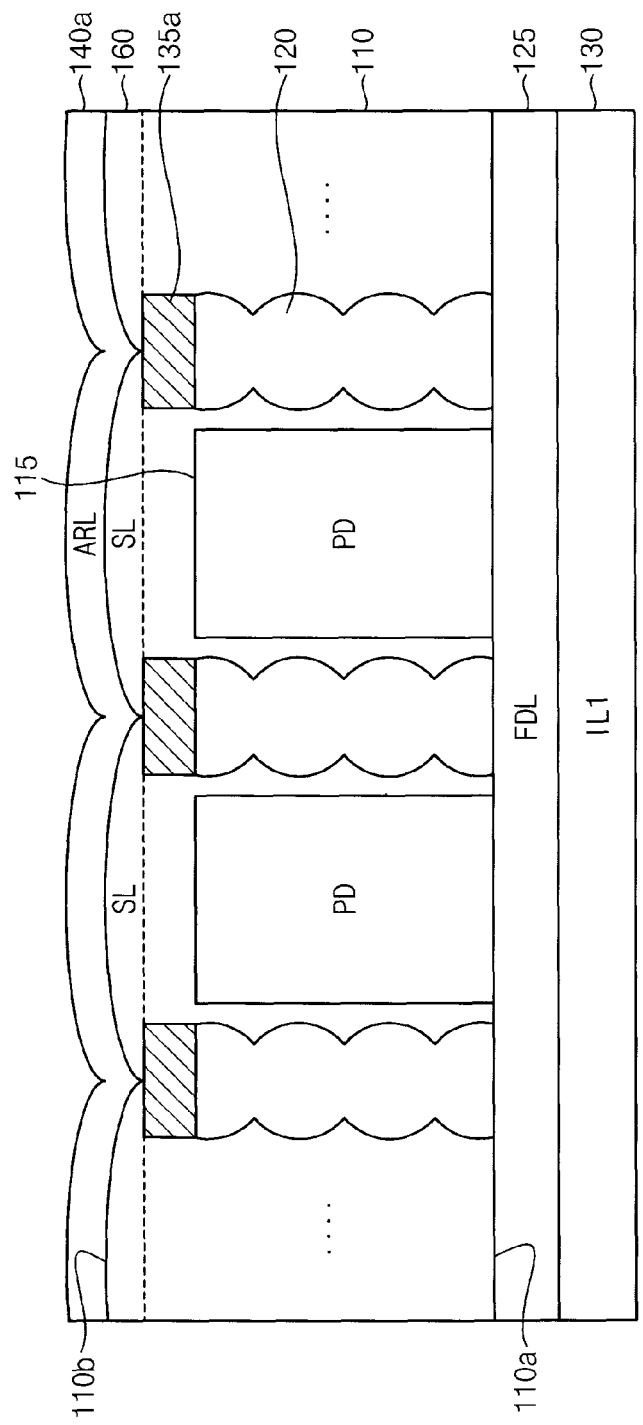
Figure 5E:
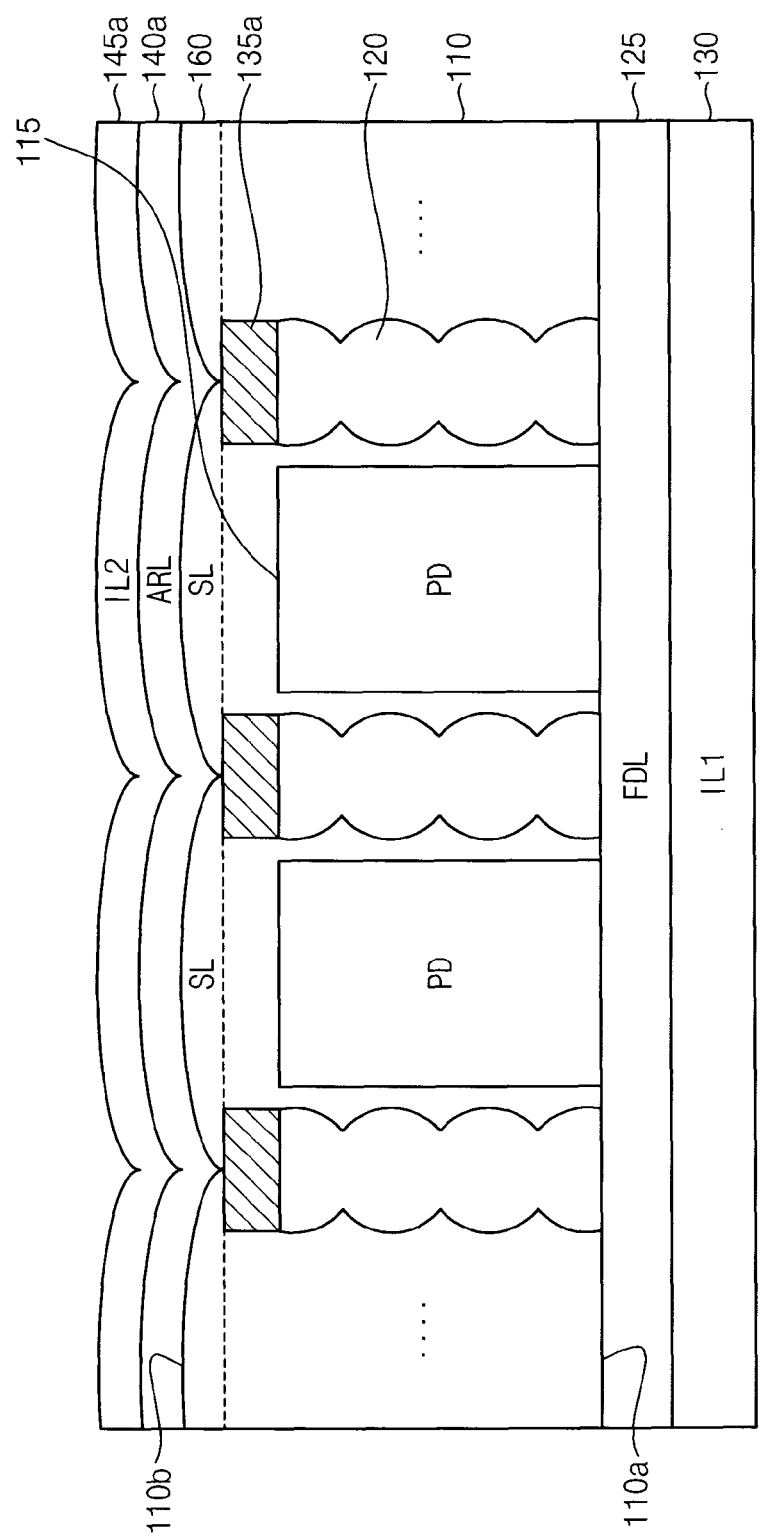

Referring to FIG. 5D, an anti-reflection layer 140a may be formed on the silicon lenses 160. The anti-reflective layer 140a may include negative fixed charges. Referring to FIG. 5E, a second dielectric layer 145a may be formed on the anti-reflective layer 140a. The anti-reflection layer 140a and the second dielectric layer 145a may be curved corresponding to the curved back surfaces of the semiconductor substrate 110.

Figure 5F:
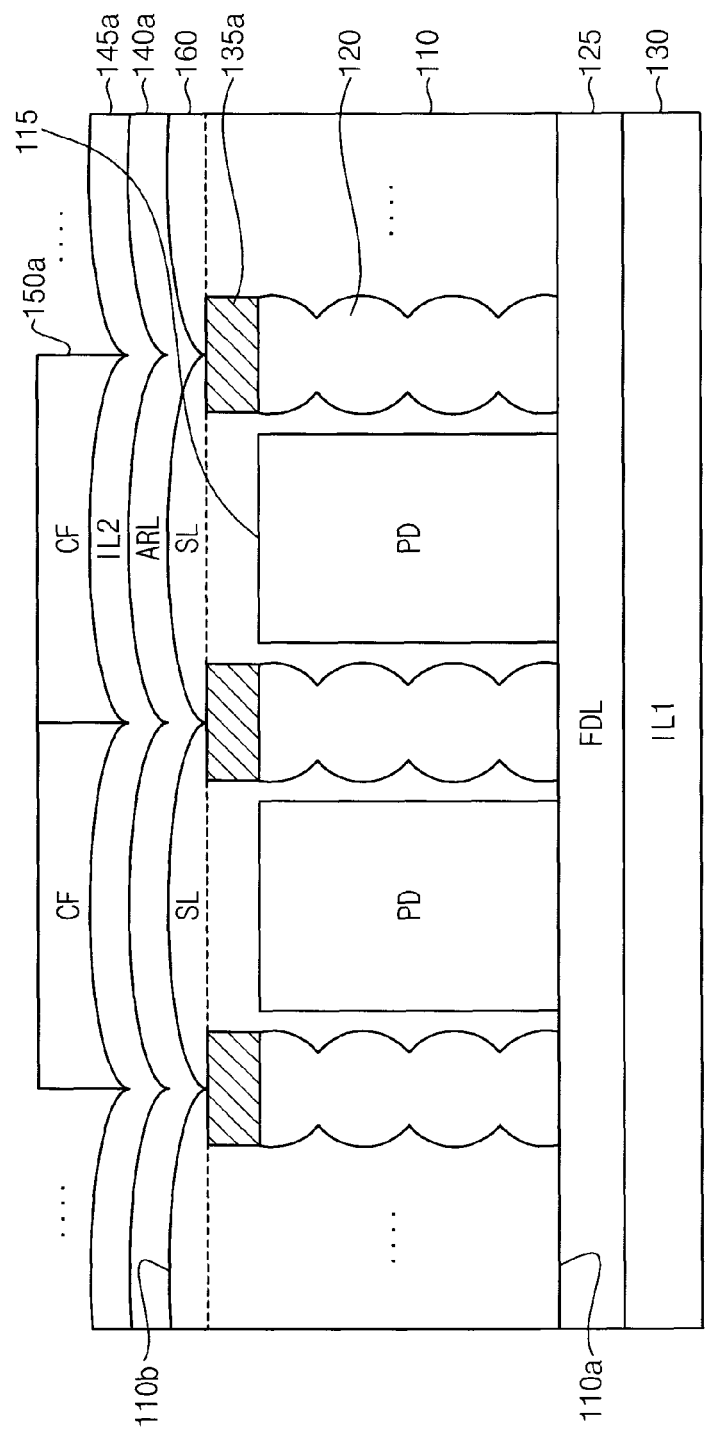
Figure 5G:
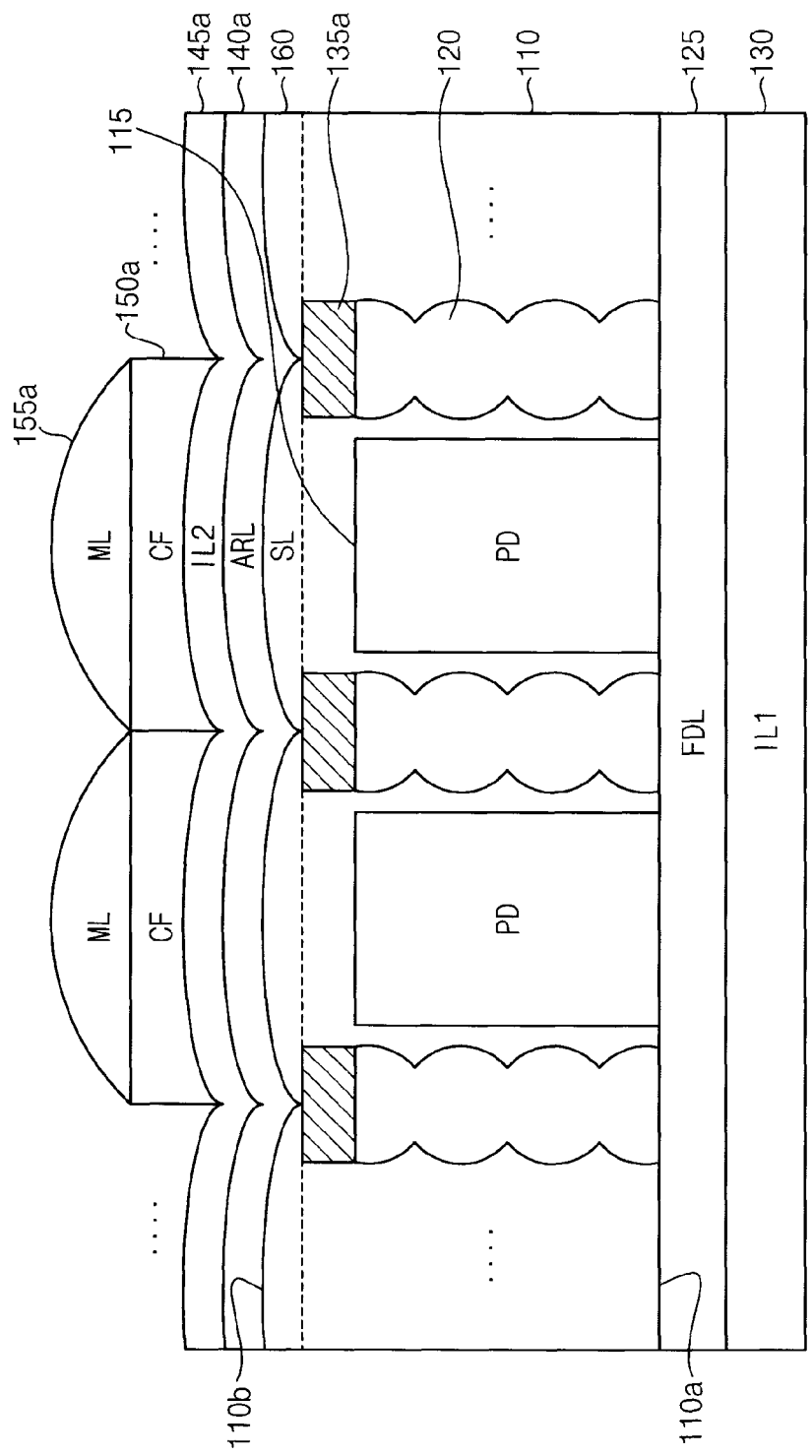

Referring to FIG. 5F, a plurality of color filters 150a may be formed on the second dielectric layer 145a. The color filters 150a may be disposed so as to correspond to the photo detecting elements 115, respectively. Referring to FIG. 5G, a plurality of micro lenses 155a may be formed on the color filters 150a. The micro lenses 155a may be disposed so as to correspond to the photo detecting elements 115a, respectively. A planarization layer (not illustrated) may be formed between the color filters 150a and the micro lenses 155a.

The image sensor illustrated in FIGS. 4, 5F and 5G may have the planarization layer (not illustrated) formed between the color filters 150a and the micro lenses 155a. The planarization layer may be formed between the second dielectric layer and the color filters, or between the anti-reflection layer and the second dielectric layer, according to example embodiments.

Figure 6:
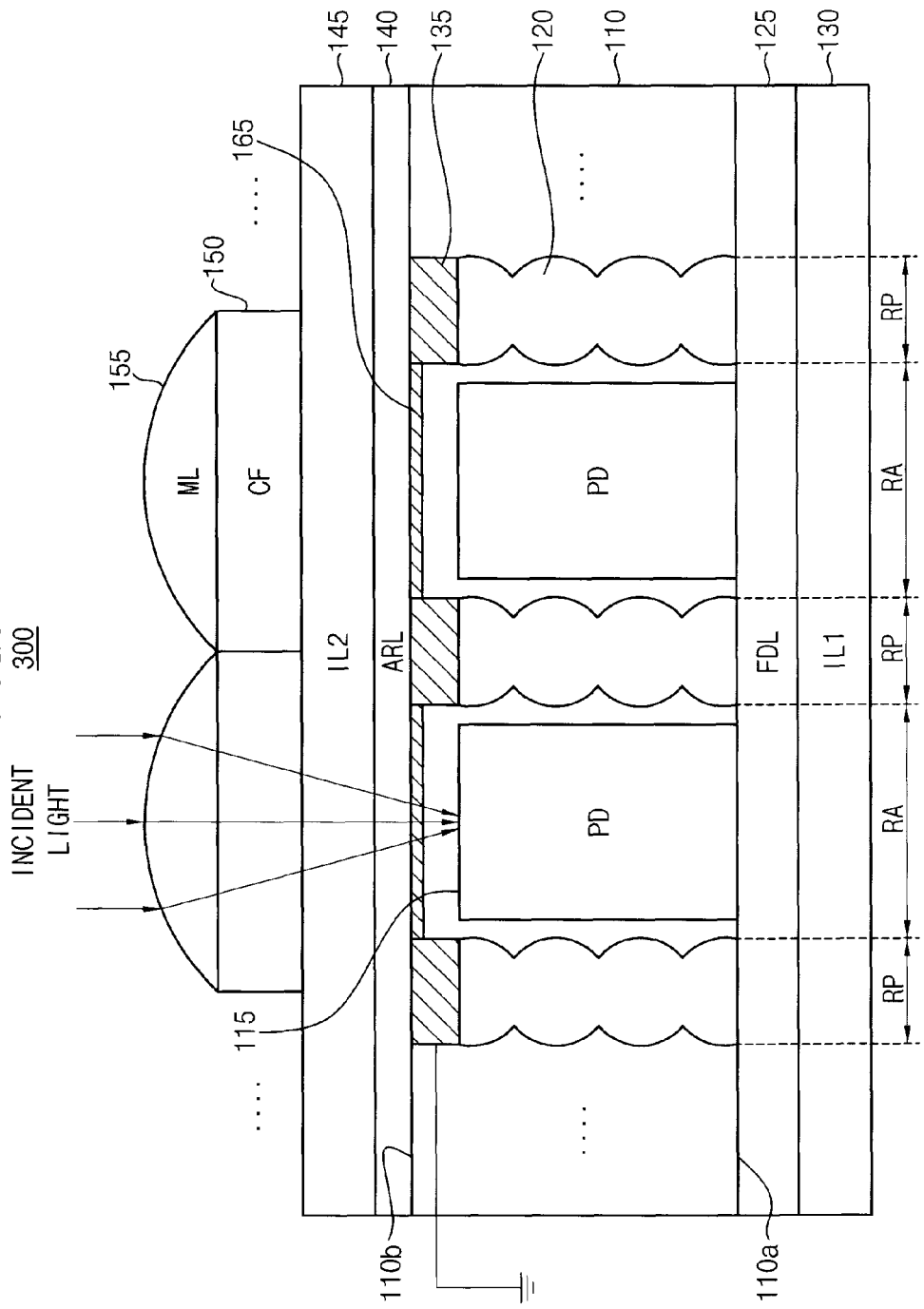
FIG. 6 is a cross-sectional view of a portion of an image sensor according to example embodiments.

FIG. 6 is a cross-sectional view of a portion of an image sensor according to example embodiments. Referring to FIG. 6, an image sensor 300 includes a semiconductor substrate 110, a plurality of photo detecting elements (PD) 115, a first backside protection pattern 135 and a plurality of second backside protection patterns 165. The image sensor 300 may further include an isolation pattern 120, a frontside protection layer (FDL) 125, a first dielectric layer (IL1) 130, an anti-reflection layer (ARL) 140, a second dielectric layer (IL2) 145, a plurality of color filters (CF) 150 and a plurality of micro lenses (ML) 155. In comparison with the image sensor 100 of FIG. 1, the image sensor 300 may further include the plurality of second backside protection patterns 165.

The semiconductor substrate 110 has a front surface 110a and a back surface 110b. The plurality of photo detecting elements 115 may be formed in an upper portion of the semiconductor substrate 110, and are separated from each other. The first backside protection pattern 135 may be formed in a lower portion of the semiconductor substrate 110 between the plurality of photo detecting elements 115. Each of the photo detecting elements 115 may be disposed in one of a plurality of active areas RA of the upper portion of the semiconductor substrate 110. The first backside protection pattern 135 may be disposed in a surrounding area RP of the lower portion of the semiconductor substrate 110. The plurality of active areas RA may be surrounded by the surrounding area RP. The active areas RA and the surrounding area RP may be implemented as illustrated in FIGS. 2A, 2B, 2C and 2D.

The plurality of second backside protection patterns 165 may be formed in the lower portion of the semiconductor substrate 110 under the plurality of photo detecting elements 115. For example, the second backside protection patterns 165 may be disposed in one of the plurality of active areas RA of the lower portion of the semiconductor substrate 110. Each of the second backside protection patterns 165 may have a thickness that is different from a thickness of the first backside protection pattern 135. For example, the thickness of each of the second backside protection patterns 165 may be smaller than the thickness of the first backside protection pattern 135. The second backside protection patterns 165 may be doped with impurities which has the same conductivity type as a conductivity type of impurities (e.g., p-type impurities) in the first backside protection pattern 135. A doping density of the second backside protection pattern 165 may be substantially the same as a doping density of the first backside protection pattern 135.

The isolation pattern 120 may be formed in the semiconductor substrate 110 between the plurality of photo detecting elements 115. The frontside protection layer 125 may be formed on the front surface 110a of the semiconductor substrate 110. The first dielectric layer 130 may be formed on the frontside protection layer 125, and may include gate structures (not shown) that transfer, amplify and output the electric signal generated by the photo detecting elements 115. The anti-reflection layer 140 may be formed on the back surface 110b of the semiconductor substrate 110. The second dielectric layer 145 may be formed on the anti-reflection layer 140. Although not illustrated in FIG. 6, the image sensor 300 may be implemented without the second dielectric layer 145. The color filters 150 may be formed on the second dielectric layer 145, and may be disposed corresponding to the photo detecting elements 115, respectively. The micro lenses 155 may be formed on the color filters 150a, and may be disposed corresponding to the photo detecting elements 115 and to the color filters 150, respectively.

In the image sensor 300 according to example embodiments, the first backside protection pattern 135 corresponding to the backside protection layer may be partially formed in the lower portion of the semiconductor substrate 110 (e.g., formed in the lower portion of the semiconductor substrate 110 between the photo detecting elements 115). Thus, the image sensor 300 may efficiently increase and/or improve quantum efficiency and may efficiently suppress and/or reduce optical crosstalk without a decrease in fill factor. In addition, the second backside protection patterns 165 that are thinner than the first backside protection pattern 135 may be formed in the lower portion of the semiconductor substrate 110 so as to correspond to the photo detecting elements 115, respectively. Thus, the image sensor 300 may effectively reduce dark currents without a decrease in sensing performance.

FIGS. 7A, 7B, 7C, 7D and 7E are cross-sectional views of an image sensor for describing a method of fabricating the image sensor of FIG. 6. In the method of fabricating the image sensor 300, a step of forming an epitaxial layer 102, a step of forming a plurality of photo detecting elements 115 and an isolation pattern 120, a step of forming a frontside protection layer 125, a step of forming a first dielectric layer 130, a step of forming a semiconductor substrate 110 by grinding the bulk silicon substrate 101 and a step of forming a first backside protection pattern 135 may be substantially the same as the steps as illustrated in FIGS. 3A, 3B, 3C, 3D, 3E and 3G, respectively.

Figure 7A:
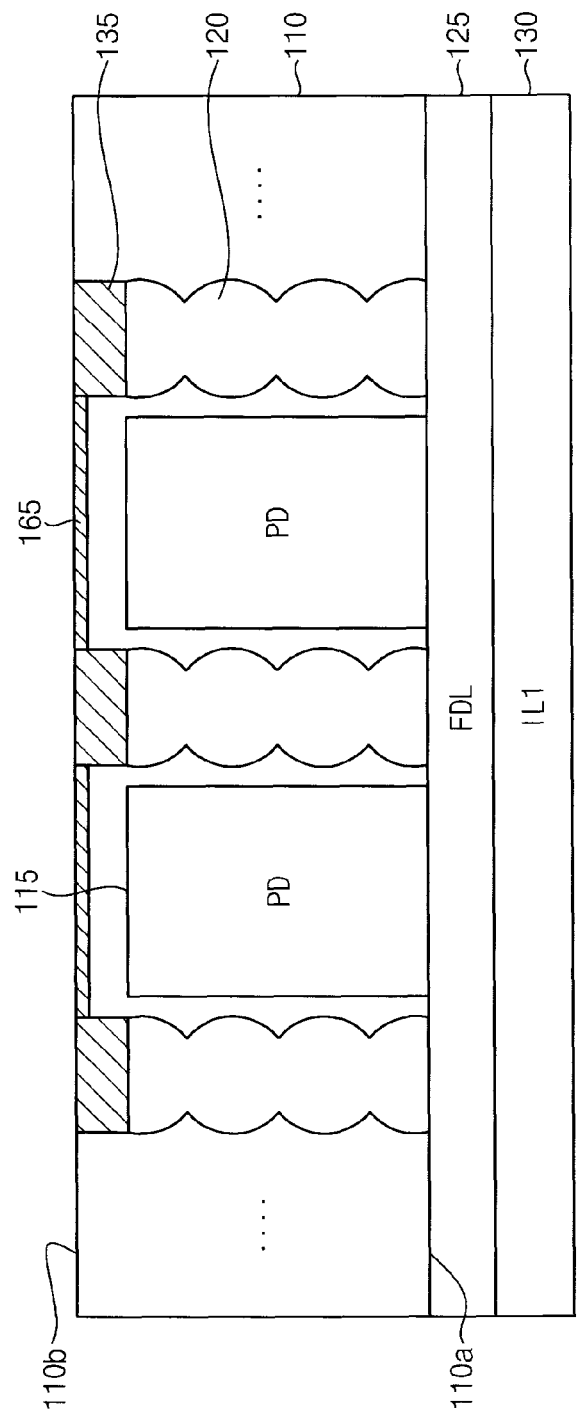
FIGS. 7A, 7B, 7C, 7D and 7E are cross-sectional views of an image sensor for describing a method of fabricating the image sensor of FIG. 6.

Referring to FIG. 7A, a plurality of second backside protection patterns 165 may be formed in the semiconductor substrate 110. For example, the second backside protection patterns 165 may be formed such that regions (e.g., (p+)-type regions) are partially formed in a lower portion of the semiconductor substrate 110 under the photo detecting elements 115 using, for example, the ion implantation process. The second backside protection patterns 165 may be formed using a mask corresponding to the active areas, and may be formed before or after the first backside protection pattern 135 is formed. The backside protection pattern 135 may have a thickness of less than about 0.1 μm. The image sensor 300 may effectively reduce dark currents by forming the second backside protection patterns 165.

Figure 7B:
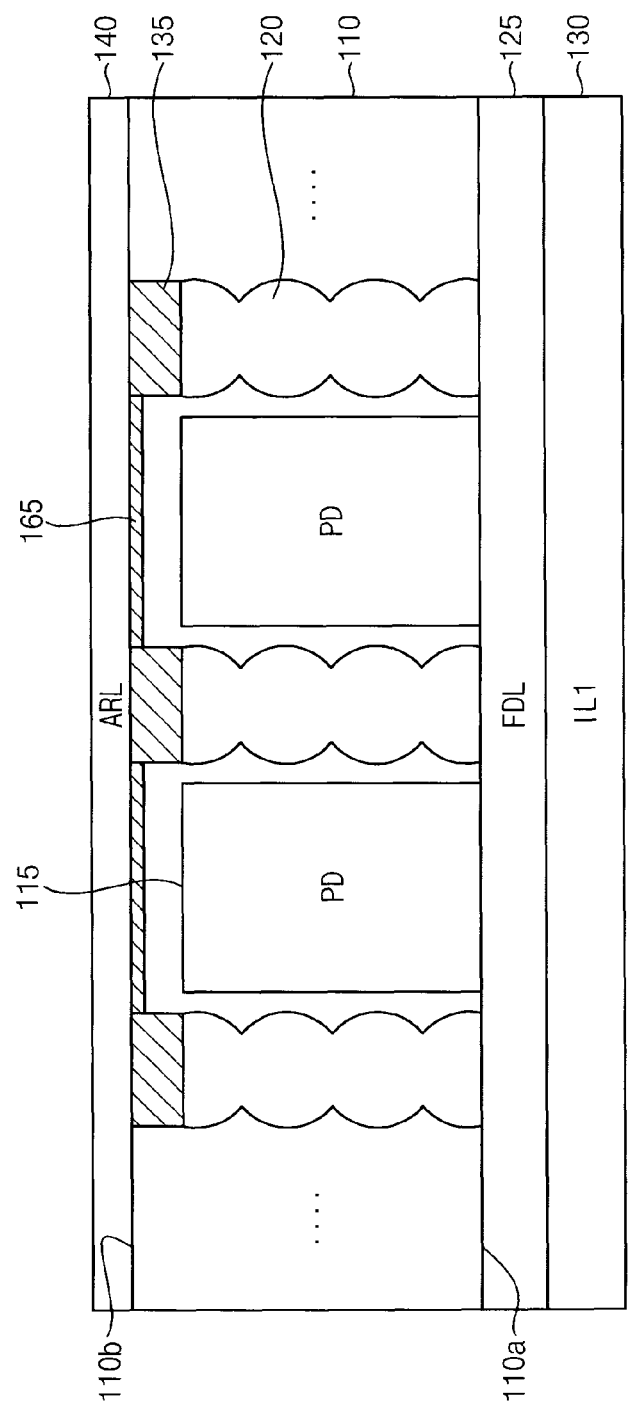
Figure 7C:
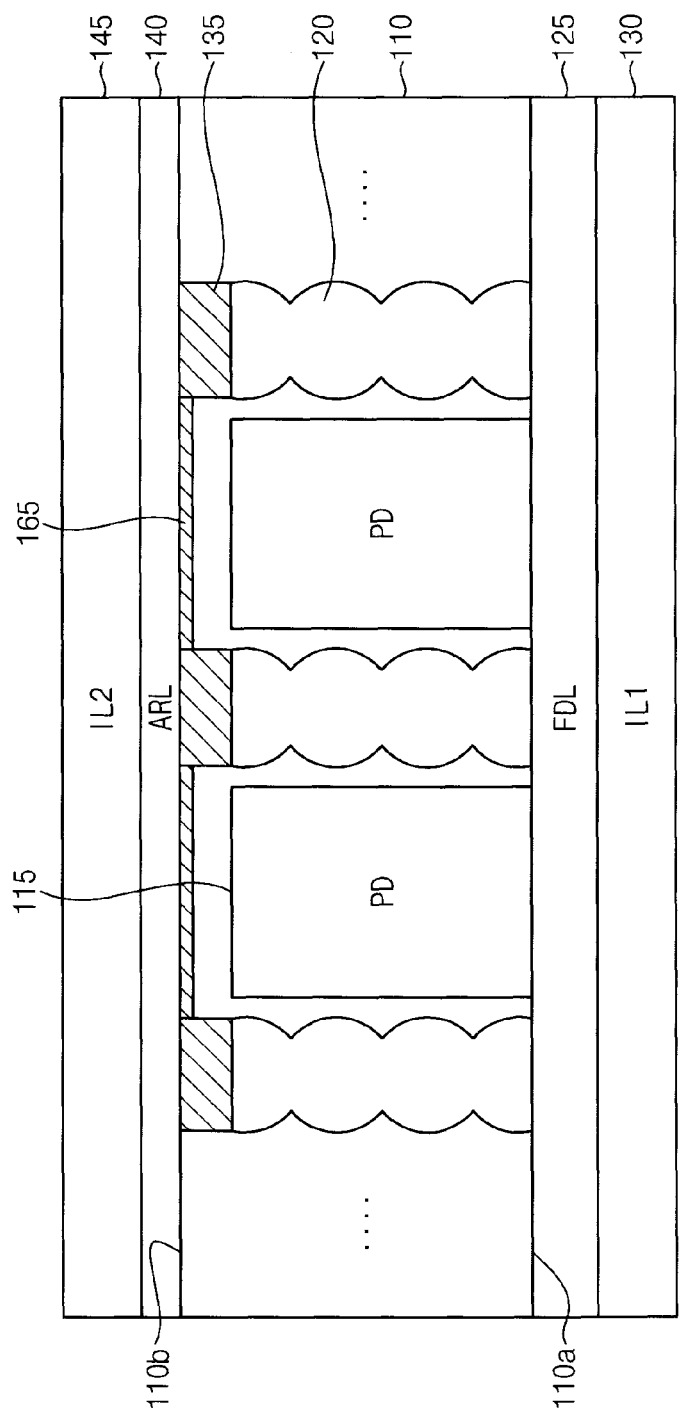
Figure 7D:
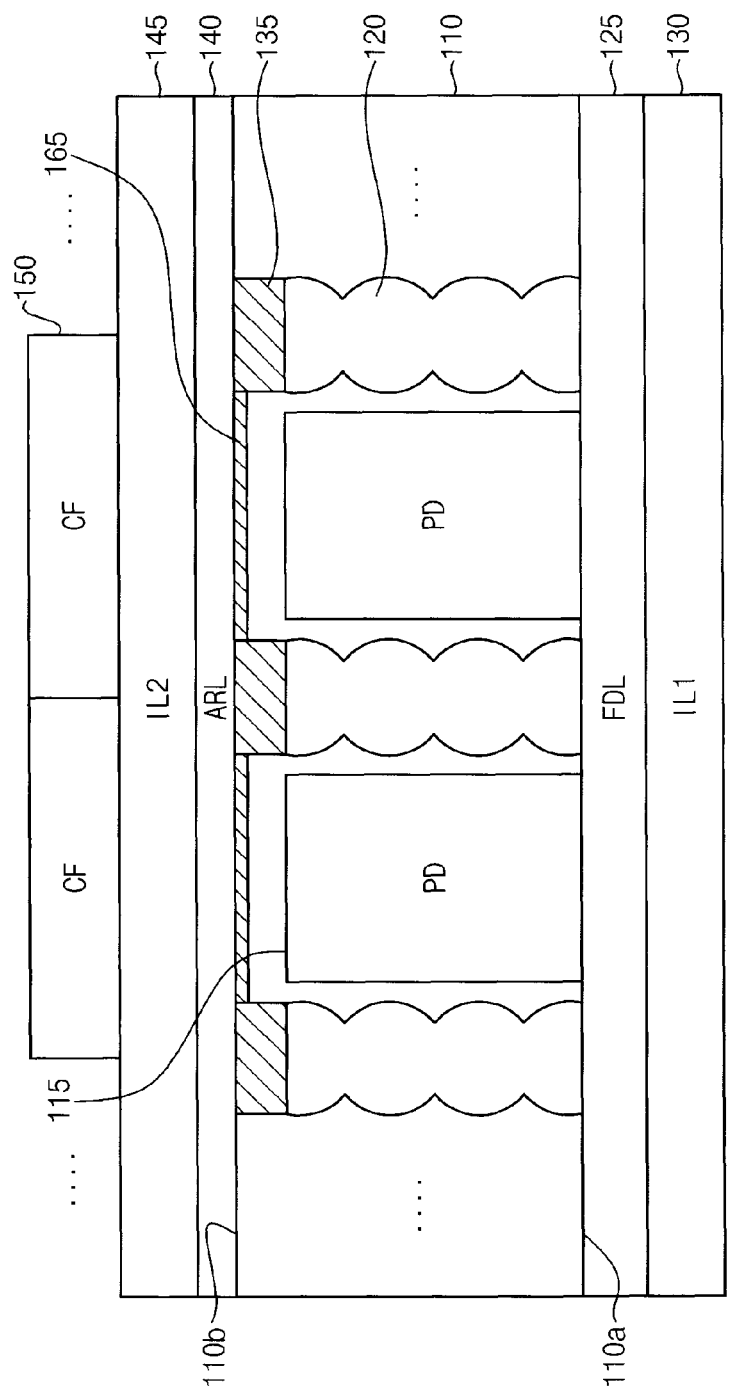
Figure 7E:
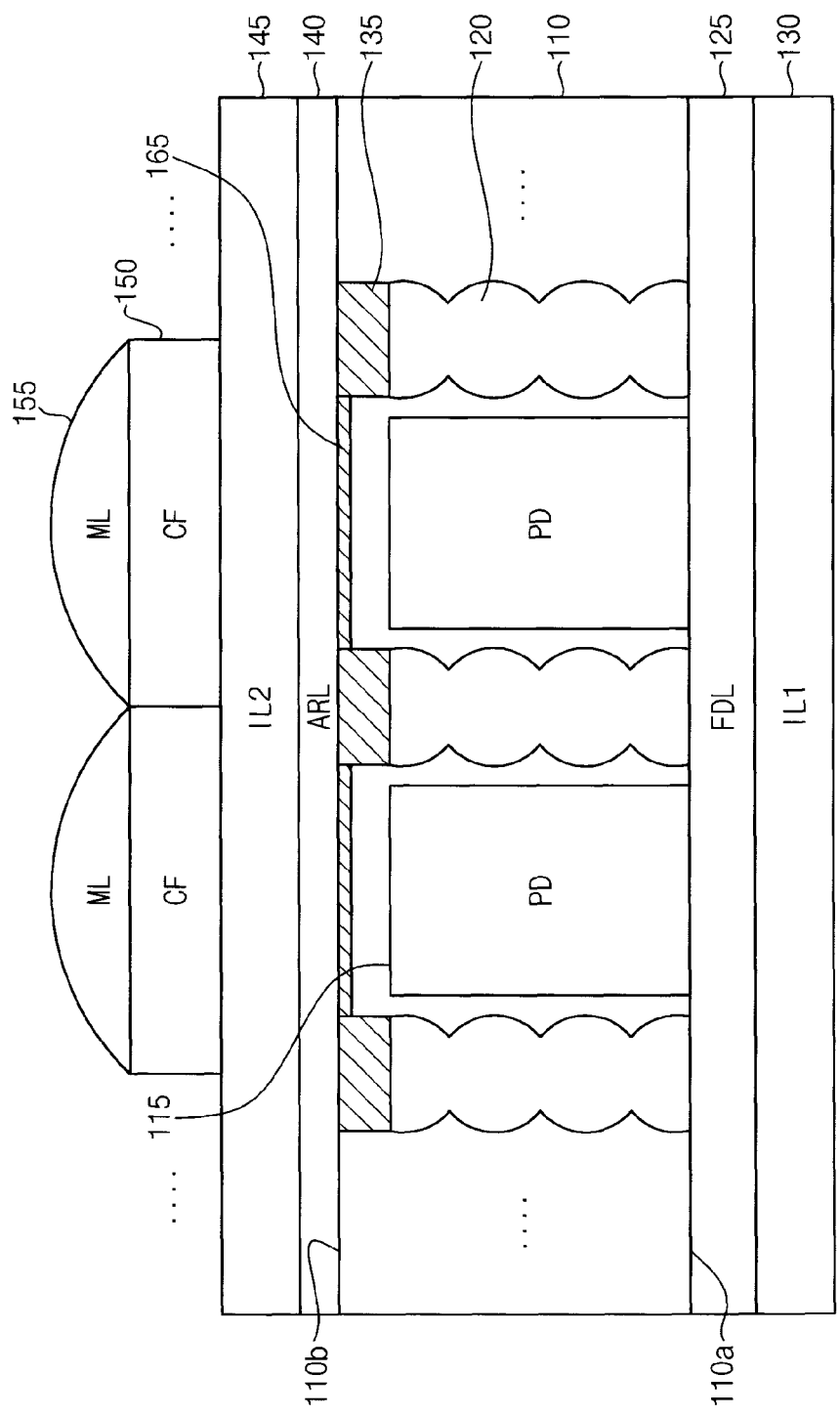

Referring to FIG. 7B, an anti-reflection layer 140 may be formed on the back surface 110b of the semiconductor substrate 110. Referring to FIG. 7C, a second dielectric layer 145 may be formed on the anti-reflective layer 140. Referring to FIG. 7D, a plurality of color filters 150 may be formed on the second dielectric layer 145. The color filters 150 may be disposed so as to correspond to the photo detecting elements 115, respectively. Referring to FIG. 7E, a plurality of micro lenses 155 may be formed on the color filters 150. The micro lenses 155 may be disposed so as to correspond to the photo detecting elements 115a, respectively.

Figure 8C:
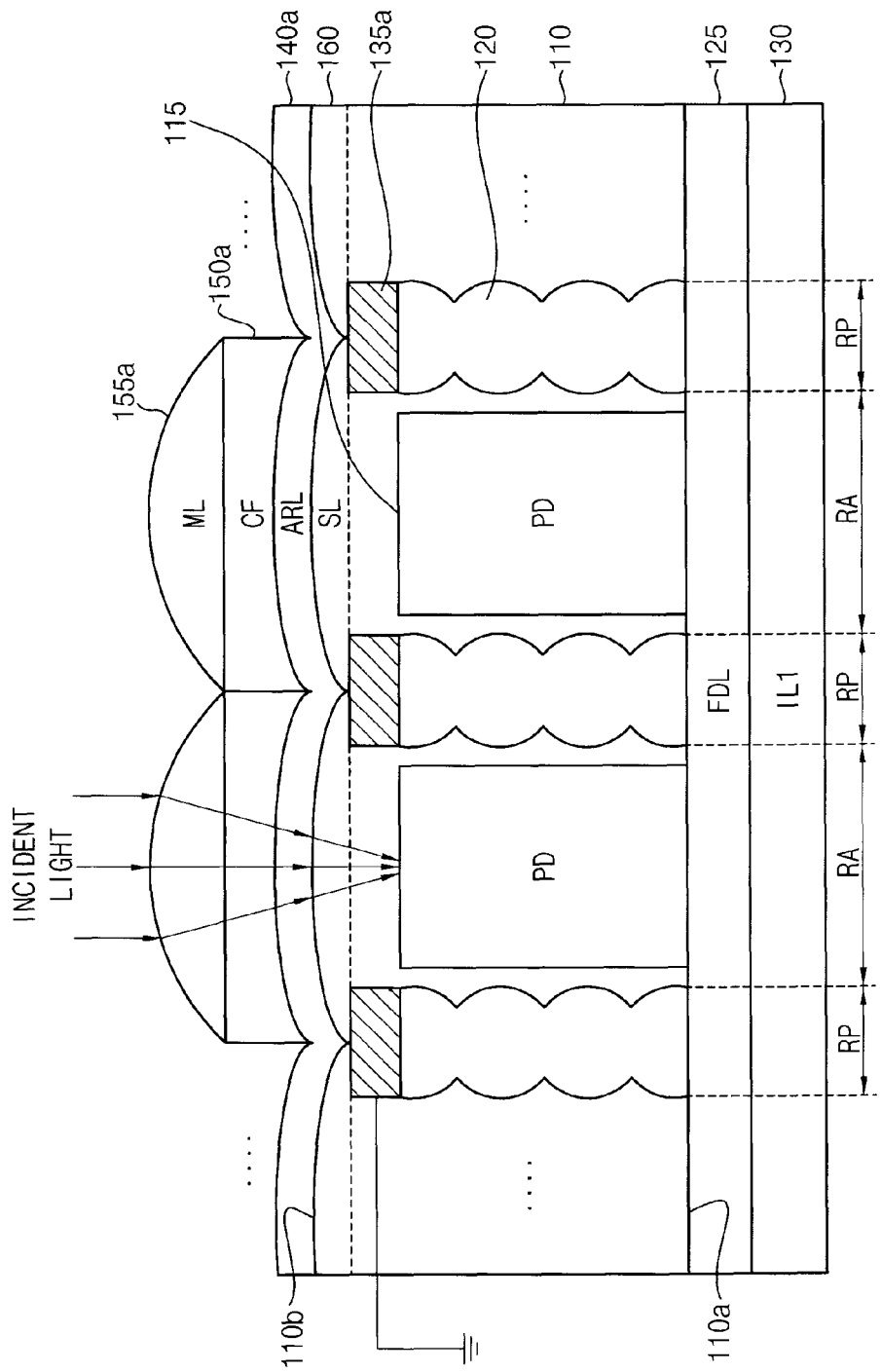

FIGS. 8A, 8B, 8C and 8D are cross-sectional views of a portion of an image sensor according to example embodiments. Referring to FIG. 8A, an image sensor 100a includes a semiconductor substrate 110, a plurality of photo detecting elements (PD) 115 and a backside protection pattern 135. The image sensor 100a may further include an isolation pattern 120, a frontside protection layer (FDL) 125, a first dielectric layer (IL1) 130, an anti-reflection layer (ARL) 140, a plurality of color filters (CF) 150 and a plurality of micro lenses (ML) 155. In comparison with the image sensor 100 of FIG. 1, the image sensor 100a may be implemented without the second dielectric layer formed between the anti-reflection layer 140 and the color filters 150.

Referring to FIG. 8B, an image sensor 200a includes a semiconductor substrate 110, a plurality of photo detecting elements (PD) 115 and a backside protection pattern 135a. The image sensor 200a may further include an isolation pattern 120, a frontside protection layer (FDL) 125, a first dielectric layer (IL1) 130, a plurality of silicon lenses (SL) 160, an anti-reflection layer (ARL) 140a, a second dielectric layer (IL2) 145b, a plurality of color filters (CF) 150b and a plurality of micro lenses (ML) 155a. In comparison with the image sensor 200 of FIG. 4, the image sensor 200a may include a planarization layer (not illustrated) formed between the second dielectric layer 145b and the color filters 150b.

Referring to FIG. 8C, an image sensor 200b includes a semiconductor substrate 110, a plurality of photo detecting elements (PD) 115 and a backside protection pattern 135a. The image sensor 200b may further include an isolation pattern 120, a frontside protection layer (FDL) 125, a first dielectric layer (ID1) 130, a plurality of silicon lenses (SL) 160, an anti-reflection layer (ARL) 140a, a plurality of color filters (CF) 150a and a plurality of micro lenses (ML) 155a. In comparison with the image sensor 200 of FIG. 4, the image sensor 200b may be implemented without the second dielectric layer formed between the anti-reflection layer 140a and the color filters 150a.

Figure 8D:
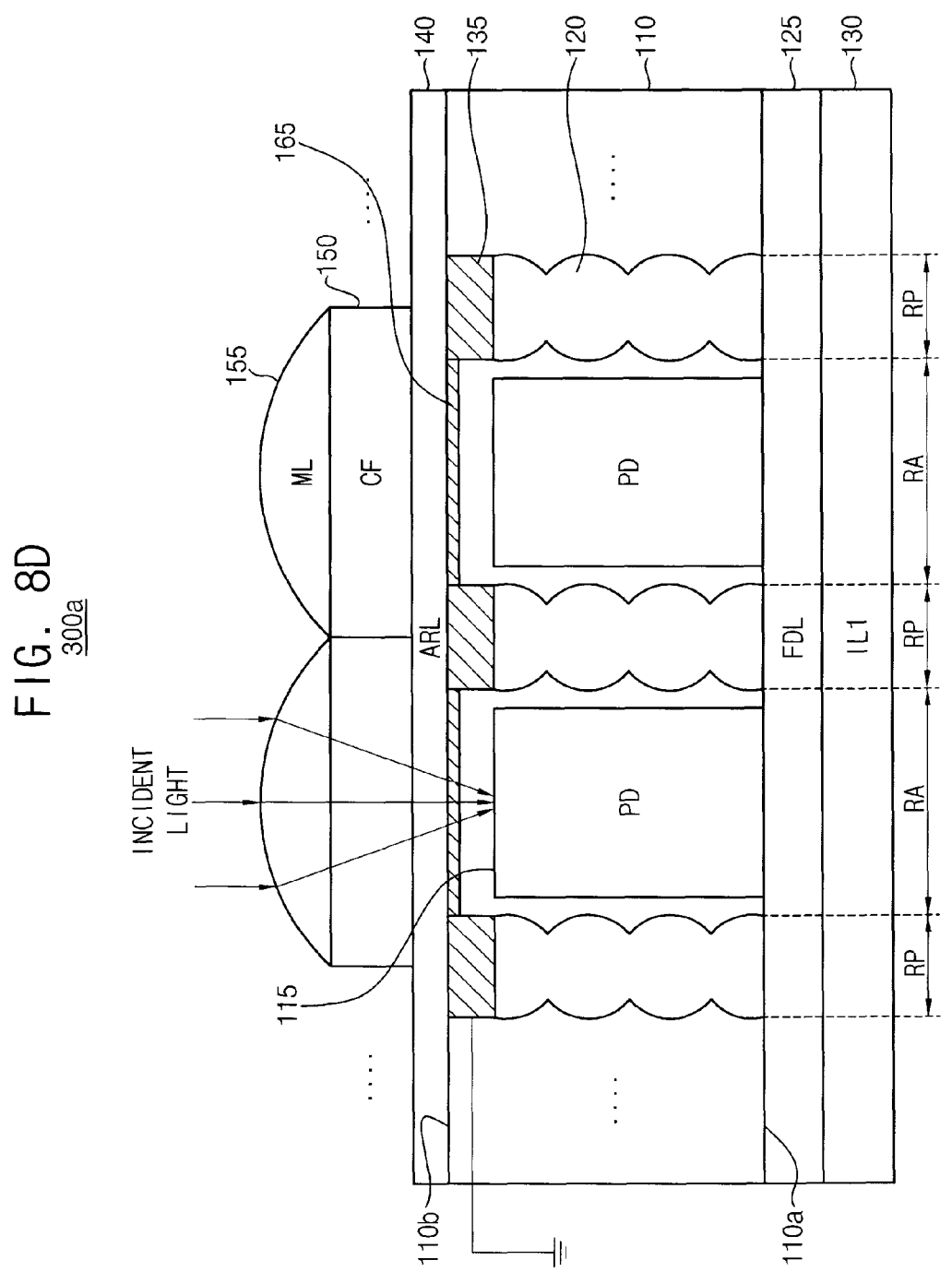

Referring to FIG. 8D, an image sensor 300a includes a semiconductor substrate 110, a plurality of photo detecting elements (PD) 115, a first backside protection pattern 135 and a plurality of second backside protection patterns 165. The image sensor 300a may further include an isolation pattern 120, a frontside protection layer (FDL) 125, a first dielectric layer (ID1) 130, an anti-reflection layer (ARL) 140, a plurality of color filters (CF) 150 and a plurality of micro lenses (ML) 155. In comparison with the image sensor 300 of FIG. 6, the image sensor 300a may be implemented without the second dielectric layer formed between the anti-reflection layer 140 and the color filters 150.

Figure 9:
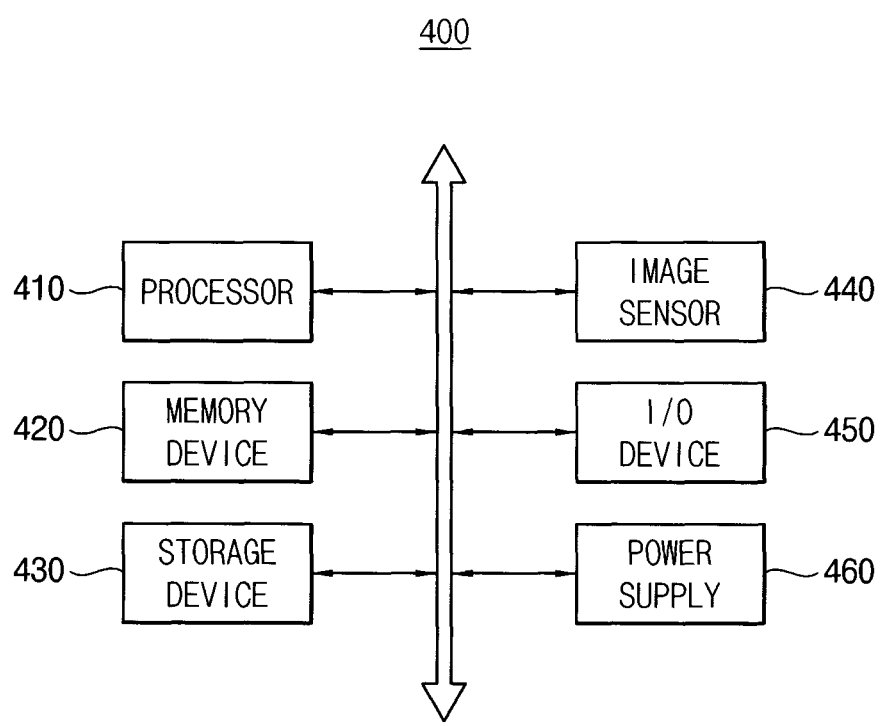
FIG. 9 is a block diagram illustrating an electronic system including the image sensor according to example embodiments.

FIG. 9 is a block diagram illustrating an electronic system including the image sensor according to example embodiments. Referring to FIG. 9, the electronic system 400 may include a processor 410, a memory device 420, a storage device 430, an input/output (I/O) device 450, a power supply 460 and an image sensor 440. Although not illustrated in FIG. 9, the electronic system 400 may further include a plurality of ports for communicating a video card, a sound card, a memory card, a universal serial bus (USB) device and/or other electric devices.

The processor 410 may perform various computing functions. The processor 410 may be a micro processor and/or a central processing unit (CPU). The processor 410 may be connected to the memory device 420, the storage device 430, and the I/O device 450 via a bus, e.g., an address bus, a control bus, and/or a data bus. The processor 410 may be connected to an extended bus, e.g., a peripheral component interconnection (PCI) bus.

The memory device 420 may store data for operations of the electronic system 400. For example, the memory device 420 may include a dynamic random access memory (DRAM) device, a static random access memory (SRAM) device, an erasable programmable read-only memory (EPROM) device, an electrically erasable programming read-only memory (EEPROM) device and/or a flash memory device.

The storage device 430 may include a solid state drive device, a hard disk drive device and/or a CD-ROM device. The I/O device 450 may include input devices, e.g., a keyboard, a keypad and/or a mouse, and output devices, e.g., a printer and/or a display device. The power supply 460 may provide a power for operations of the electronic system 400.

The image sensor 440 may communicate with the processor 410 via the bus or other communication links. The image sensor 440 may be the image sensor 100 of FIG. 1, the image sensor 200 of FIG. 4, the image sensor 300 of FIG. 6, the image sensor 100a of FIG. 8A, the image sensor 200a of FIG. 8B, the image sensor 200b of FIG. 8C, or the image sensor 300a of FIG. 8D. In the image sensor 440, the backside protection pattern may be formed in the surrounding area of the lower portion of the semiconductor substrate (e.g., in the lower portion of the semiconductor substrate between the plurality of photo detecting elements), and may not be formed in the active areas of the lower portion of the semiconductor substrate (e.g., in the lower portion of the semiconductor substrate under the plurality of photo detecting elements), thereby improving quantum efficiency and efficiently reducing optical crosstalk without a decrease in fill factor.

In example embodiments, the image sensor 440 and the processor 410 may be fabricated as one integrated circuit chip. In example embodiments, the image sensor 440 and the processor 410 may be fabricated as two separate integrated circuit chips.

FIG. 10 is a block diagram illustrating an example of an interface used for the electronic system of FIG. 9. Referring to FIG. 10, the electronic system 1000 may be implemented by a data processing device that uses, or supports a mobile industry processor interface (MIPI) interface (e.g., a mobile phone, a personal digital assistant (PDA), a portable multimedia player (PMP), and/or a smart phone). The electronic system 1000 may include an application processor 1110, an image sensor 1140 and/or a display device 1150.

A CSI host 1112 of the application processor 1110 may perform a serial communication with a CSI device 1141 of the image sensor 1140 using a camera serial interface (CSI). In example embodiments, the CSI host 1112 may include a light deserializer (DES), and the CSI device 1141 may include a light serializer (SER). A DSI host 1111 of the application processor 1110 may perform a serial communication with a DSI device 1151 of the display device 1150 using a display serial interface (DSI). In example embodiments, the DSI host 1111 may include a light serializer (SER), and the DSI device 1151 may include a light deserializer (DES).

The electronic system 1000 may further include a radio frequency (RF) chip 1160. The RF chip 1160 may perform a communication with the application processor 1110. A physical layer (PHY) 1113 of the electronic system 1000 and a physical layer (PHY) 1161 of the RF chip 1160 may perform data communications based on a MIPI DigRF. The application processor 1110 may further include a DigRF MASTER 1114 that controls the data communications of the PHY 1161.

The electronic system 1000 may include a global positioning system (GPS) 1120, a storage 1170, a MIC 1180, a DRAM device 1185, and a speaker 1190. In addition, the electronic system 1000 may perform communications using an ultra wideband (UWB) 1220, a wireless local area network (WLAN) 1220 and/or a worldwide interoperability for microwave access (WIMAX) 1230. However, the structure and the interface of the electronic system 1000 are not limited thereto.

The above described embodiments may be applied to an image sensor, and an electronic system having the image sensor. For example, the electronic system may be a system using an image sensor, e.g., a computer, a digital camera, a 3-D camera, a cellular phone, a personal digital assistant (PDA), a scanner, a navigation system, a video phone, a surveillance system, an auto-focusing system, a tracking system, a motion-sensing system and/or an image-stabilization system.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An image sensor, comprising:
   a plurality of photo detecting elements in an upper portion of a semiconductor substrate, the plurality of photo detecting elements being separate from each other; and
   a backside protection pattern in a lower portion of the semiconductor substrate between the plurality of photo detecting elements,
   wherein the backside protection pattern is doped with impurities which have the same conductivity type as a conductivity type of impurities in the semiconductor substrate, and
   wherein a doping density of the backside protection pattern is higher than a doping density of the semiconductor substrate.

2. The image sensor of claim 1, wherein
   each photo detecting element of the plurality of photo detecting elements is disposed in one of a plurality of active areas of the semiconductor substrate, and
   the backside protection pattern is disposed in a surrounding area of the semiconductor substrate, the plurality of active areas being surrounded by the surrounding area.

3. The image sensor of claim 2, wherein the surrounding area corresponds to a grid pattern.

4. The image sensor of claim 2, wherein each active area of the plurality of active areas corresponds to a circle or a polygon.

5. The image sensor of claim 4, wherein each active area of the plurality of active areas is one of a same and different size as another active area of the plurality of active areas.

6. An image sensor, comprising:
a plurality of photo detecting elements in an upper portion of a semiconductor substrate, the plurality of photo detecting elements being separate from each other;
a backside protection pattern in a lower portion of the semiconductor substrate between the plurality of photo detecting elements; and
an isolation pattern on the backside protection pattern in the semiconductor substrate between the plurality of photo detecting elements, wherein a ground voltage is provided to the image sensor through the backside protection pattern and the isolation pattern.

7. The image sensor of claim 1, further comprising:
an anti-reflection layer on a back surface of the semiconductor substrate.

8. The image sensor of claim 7, wherein the anti-reflection layer includes negative fixed charges.

9. The image sensor of claim 7, further comprising:
a plurality of color filters on the anti-reflection layer, each color filter of the plurality of color filters corresponding to one of the plurality of photo detecting elements, respectively; and
a plurality of micro lenses on the plurality of color filters, each micro lens of the plurality of micro lenses corresponding to one of the plurality of photo detecting elements, respectively.

10. The image sensor of claim 1, wherein the semiconductor substrate includes a plurality of curved back surfaces, each of the plurality of curved back surfaces corresponding to one of the plurality of photo detecting elements, respectively.

11. The image sensor of claim 10, wherein
the plurality of curved back surfaces are a plurality of convex surfaces, and
each photo detecting element of the plurality of photo detecting elements receives light through each convex surface of the plurality of convex surfaces.

12. An image sensor, comprising:
a plurality of photo detecting elements in an upper portion of a semiconductor substrate, the plurality of photo detecting elements being separate from each other;
a first backside protection pattern in a lower portion of the semiconductor substrate between the plurality of photo detecting elements; and
a plurality of second backside protection patterns in the lower portion of the semiconductor substrate under the plurality of photo detecting elements, each second backside protection pattern of the plurality of second backside protection patterns having a different thickness than the first backside protection pattern,
wherein the first backside protection pattern is doped with impurities which have the same conductivity type as a conductivity type of impurities in the semiconductor substrate, and
wherein a doping density of the first backside protection pattern is higher than a doping density of the semiconductor substrate.

13. The image sensor of claim 12, wherein the thickness of each second backside protection pattern of the plurality of second backside protection patterns is smaller than the thickness of the first backside protection pattern.

14. The image sensor of claim 12, wherein
each second backside protection pattern of the plurality of second backside protection patterns is in one of a plurality of active areas of the semiconductor substrate, and
the first backside protection pattern is in a surrounding area of the semiconductor substrate, the plurality of active areas being surrounded by the surrounding area.

15. An image sensor, comprising:
a photo detecting element in an active area of a semiconductor substrate; and
a backside protection pattern in a surrounding area of the semiconductor substrate, the active area surrounded by the surrounding area,
wherein the backside protection pattern is doped with impurities which have the same conductivity type as a conductivity type of impurities in the semiconductor substrate, and
wherein a doping density of the backside protection pattern is higher than a doping density of the semiconductor substrate.

16. The image sensor of claim 15, wherein the active area is a plurality of active areas, and the surrounding area corresponds to a grid pattern.

17. The image sensor of claim 16, wherein each active area of the plurality of active areas corresponds to one of a circle and a polygon.

18. The image sensor of claim 16, wherein a size of each active area of the plurality of active areas is the same.

19. The image sensor of claim 16, wherein a size of each active area of the plurality of active areas is different.

* * * * *